(12) United States Patent
Yu et al.

(10) Patent No.: US 10,283,473 B1
(45) Date of Patent: May 7, 2019

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Chun-Hui Yu, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/854,736

(22) Filed: Dec. 26, 2017

Related U.S. Application Data

(60) Provisional application No. 62/581,052, filed on Nov. 3, 2017.

(51) Int. Cl.
| | |
|---|---|
| H01L 23/00 | (2006.01) |
| H01L 23/31 | (2006.01) |
| H01L 23/48 | (2006.01) |
| H01L 25/065 | (2006.01) |
| H01L 23/538 | (2006.01) |
| H01L 21/683 | (2006.01) |
| H01L 21/56 | (2006.01) |
| H01L 21/768 | (2006.01) |
| H01L 21/3105 | (2006.01) |
| H01L 25/00 | (2006.01) |
| H01L 21/66 | (2006.01) |

(52) U.S. Cl.
CPC ........ *H01L 24/24* (2013.01); *H01L 21/31058* (2013.01); *H01L 21/568* (2013.01); *H01L 21/6835* (2013.01); *H01L 21/76802* (2013.01); *H01L 21/76877* (2013.01); *H01L 23/3128* (2013.01); *H01L 23/3135* (2013.01); *H01L 23/481* (2013.01); *H01L 23/5386* (2013.01); *H01L 24/05* (2013.01); *H01L 24/19* (2013.01); *H01L 24/20* (2013.01); *H01L 25/0652* (2013.01); *H01L 25/0657* (2013.01); *H01L 25/50* (2013.01); *H01L 22/32* (2013.01); *H01L 24/16* (2013.01); *H01L 2221/68359* (2013.01); *H01L 2224/16145* (2013.01); *H01L 2224/211* (2013.01); *H01L 2224/24137* (2013.01); *H01L 2224/24145* (2013.01); *H01L 2225/06513* (2013.01); *H01L 2225/06524* (2013.01); *H01L 2225/06548* (2013.01); *H01L 2225/06586* (2013.01); *H01L 2225/06596* (2013.01)

(58) Field of Classification Search
CPC ...................................... H01L 24/24
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| | (Continued) | |

*Primary Examiner* — William Coleman
(74) *Attorney, Agent, or Firm* — JCIPRNET

(57) ABSTRACT

A package structure includes an insulating encapsulation, at least one first chip, a redistribution layer and a bonding layer. The at least one first chip is encapsulated in the insulating encapsulation. The redistribution layer is located on the insulating encapsulation and the at least one first chip and electrically connected to the at least one first chip. The bonding layer mechanically connects the redistribution layer and the at least one first chip.

20 Claims, 20 Drawing Sheets

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,324,583 B2 * | 4/2016 | Shi | H01L 21/561 |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,812,426 B1 * | 11/2017 | Wang | H01L 25/50 |
| 9,870,997 B2 * | 1/2018 | Chang | H01L 23/3128 |
| 10,037,961 B2 * | 7/2018 | Chiu | H01L 24/14 |
| 2018/0012774 A1 * | 1/2018 | Hu | H01L 21/4853 |

* cited by examiner

US 10,283,473 B1

PACKAGE STRUCTURE AND MANUFACTURING METHOD THEREOF

CROSS-REFERENCE TO RELATED APPLICATION

This application claims the priority benefit of U.S. provisional application Ser. No. 62/581,052, filed on Nov. 3, 2017. The entirety of the above-mentioned patent application is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. Currently, integrated fan-out packages are becoming increasingly popular for their compactness. The improved routing capability and reliability provided by the integrated fan-out packages are key factors for future packages, where the planarization of the reconstitution wafer has greatly impact on the formation of a redistribution layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
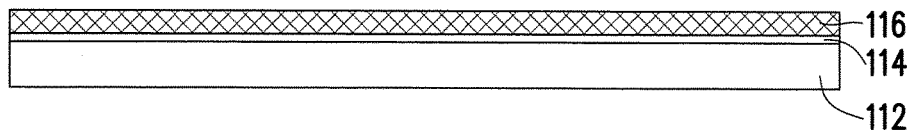
FIG. 1A to FIG. 1P are schematic cross-sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
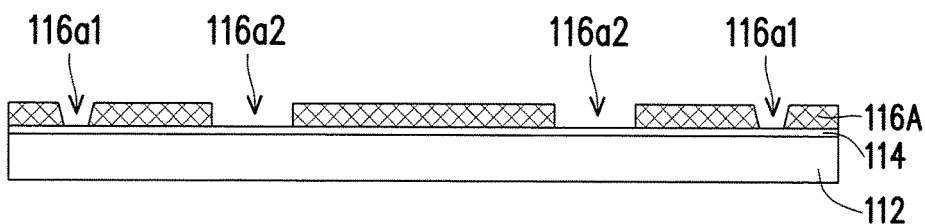
Figure 1C:
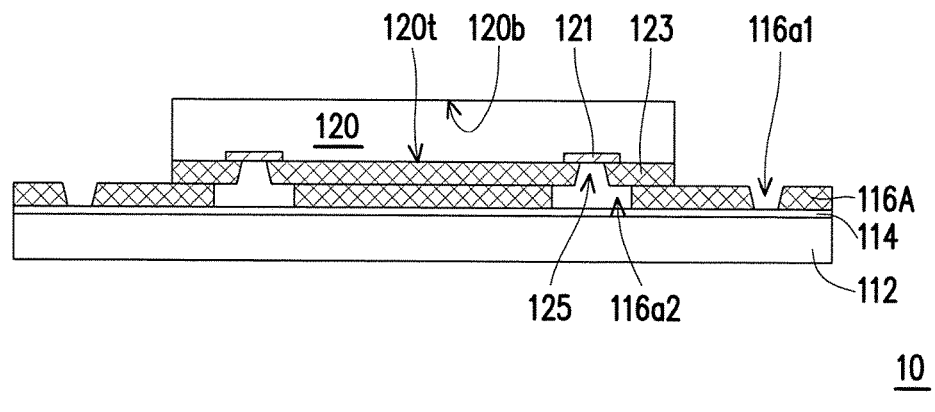
Figure 1D:
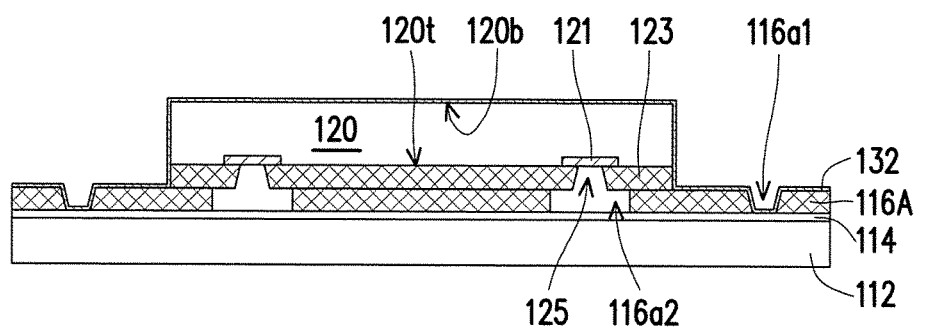
Figure 1E:
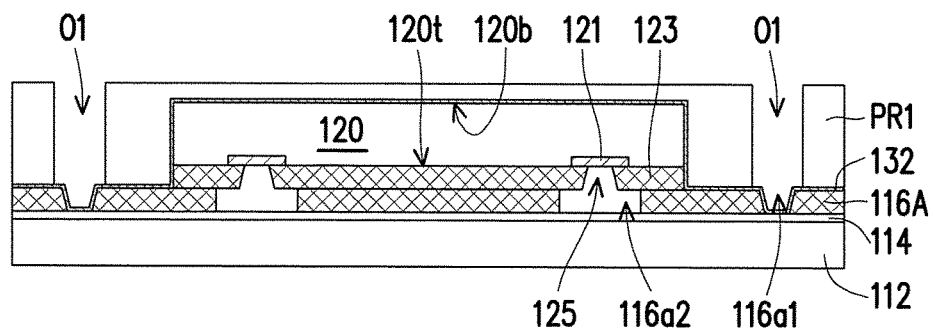
Figure 1F:
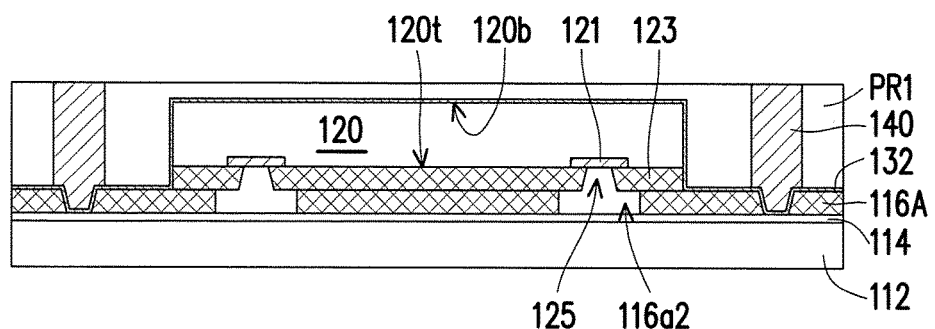
Figure 1G:
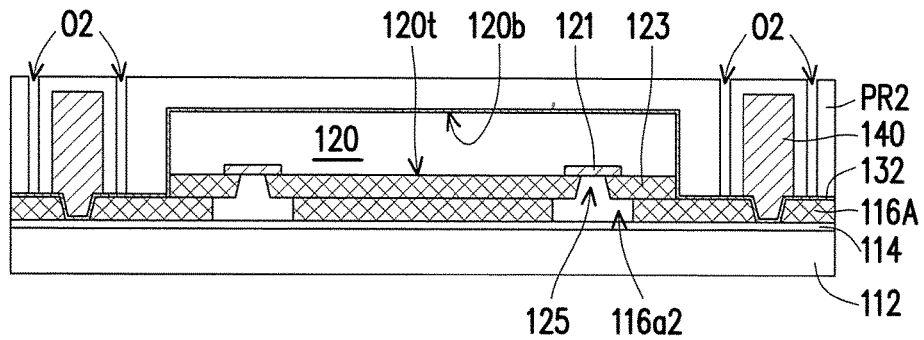
Figure 1H:
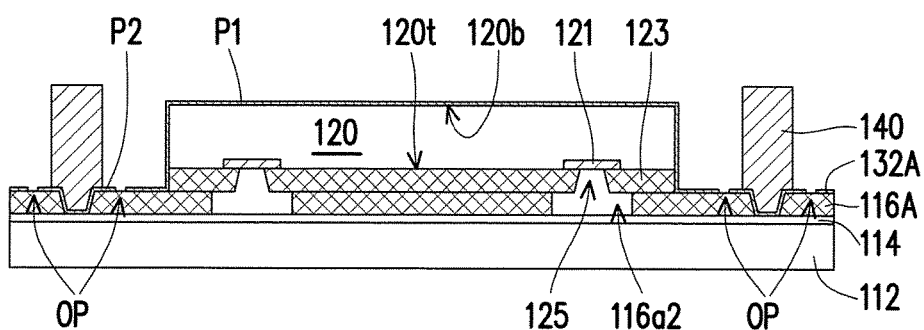
Figure 1I:
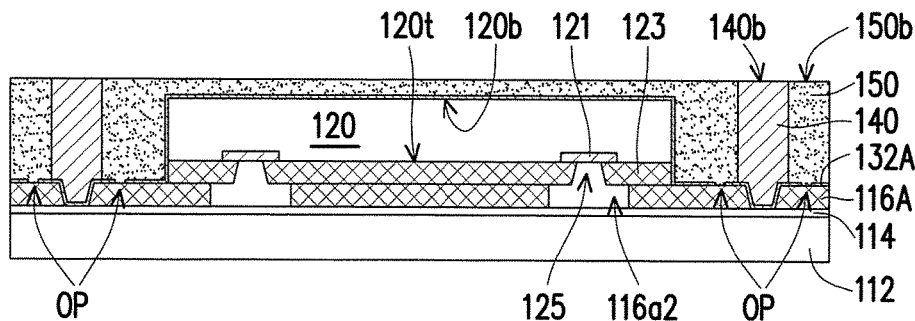
Figure 1J:
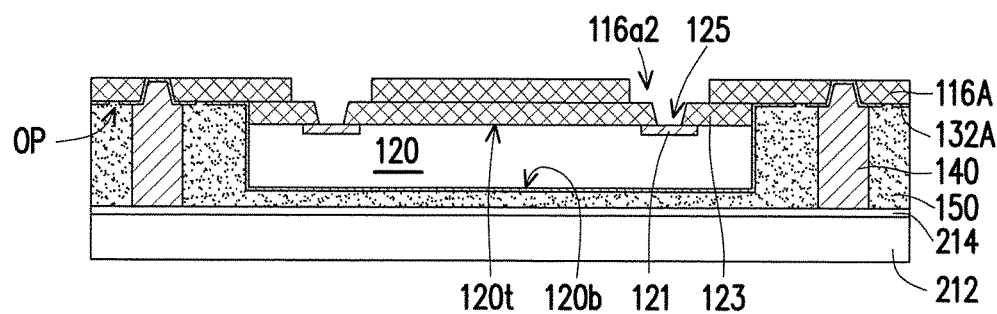
Figure 1K:
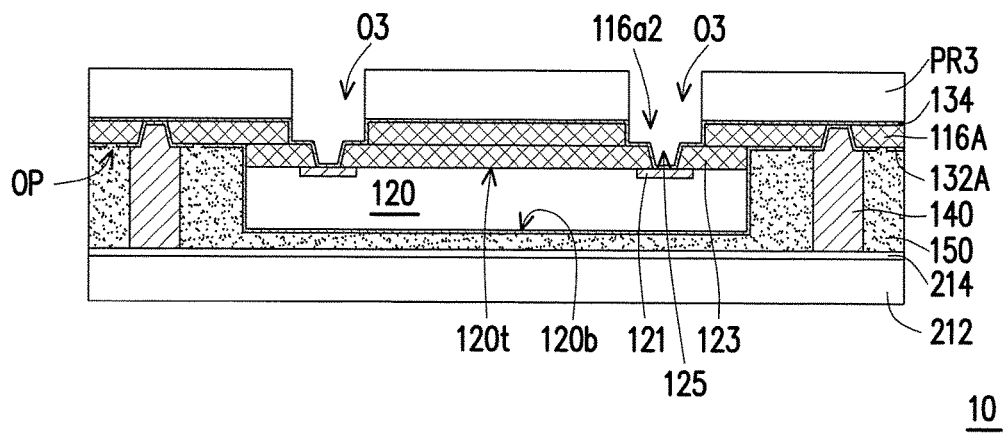
Figure 1L:
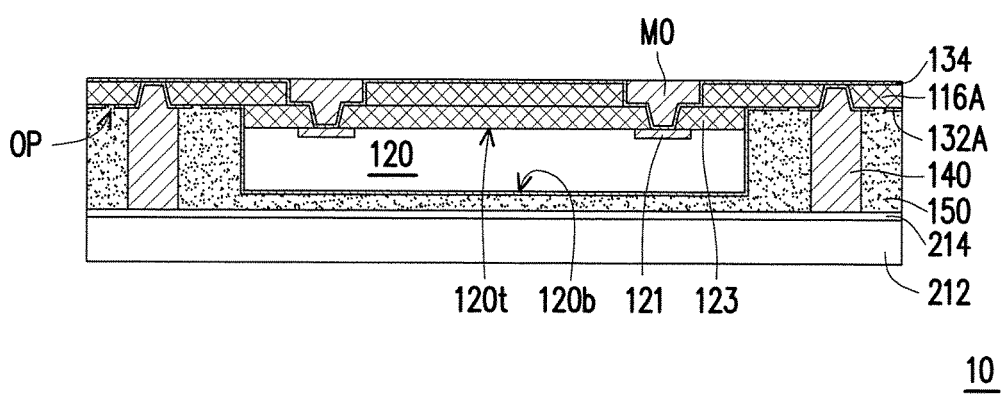
Figure 1M:
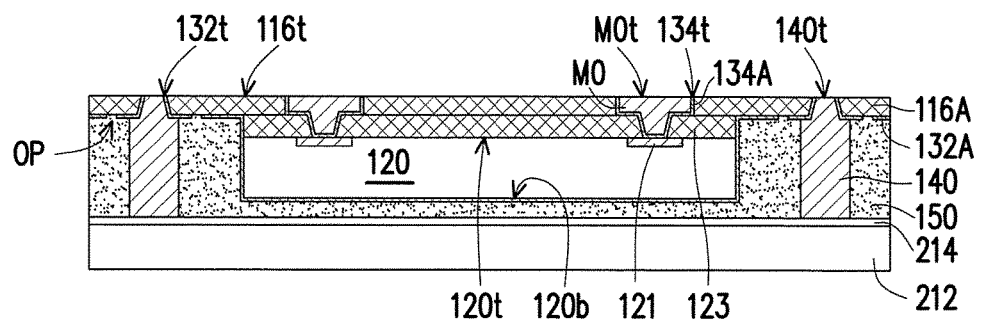
Figure 1N:
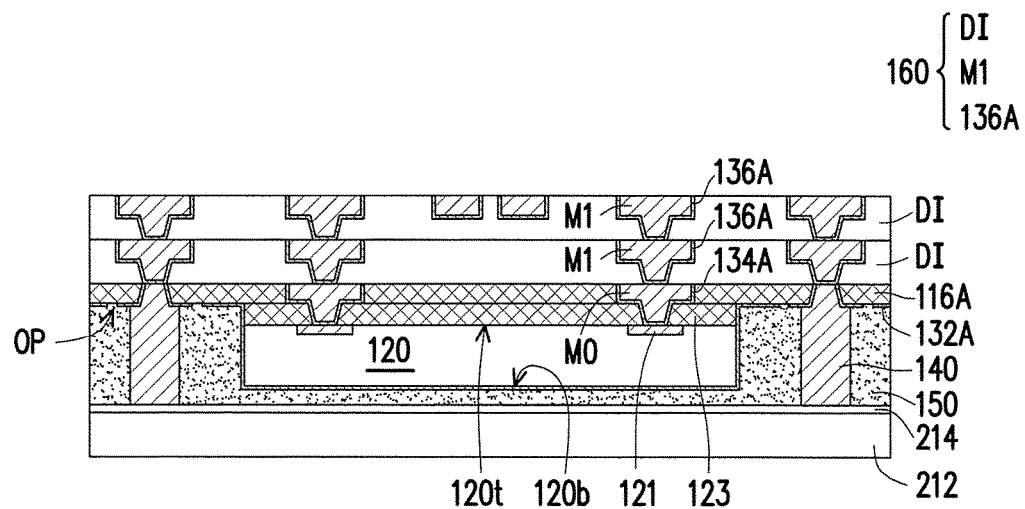
Figure 1O:
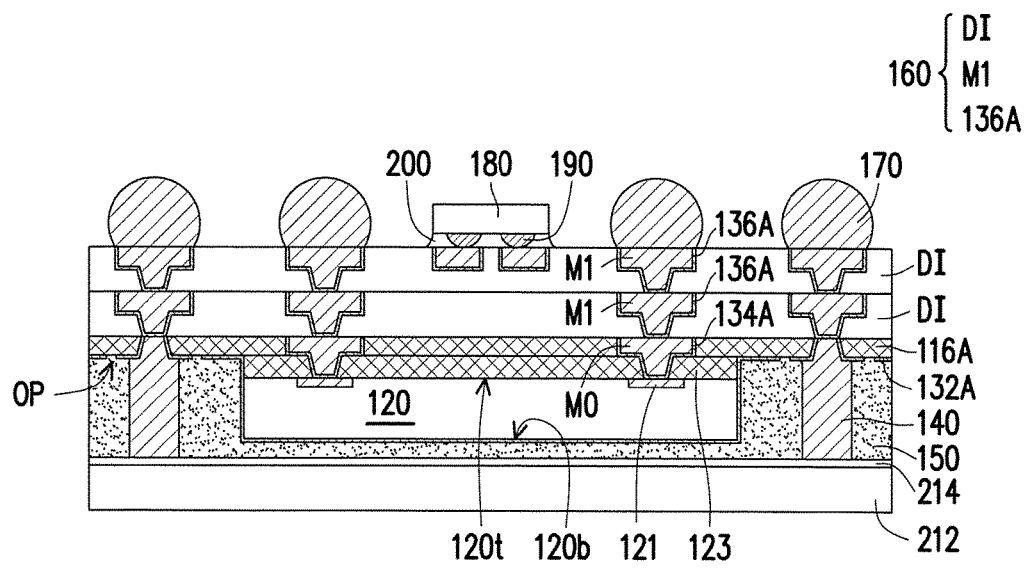
Figure 1P:
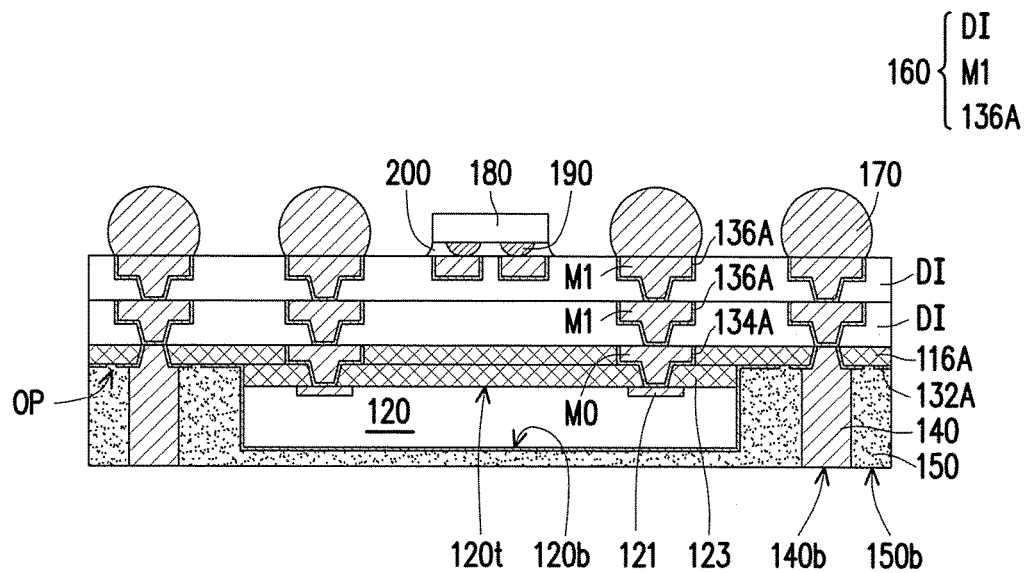

FIG. 1A to FIG. 1P are schematic cross-sectional views of various stages in a manufacturing method of a package structure according to some exemplary embodiments of the present disclosure. In FIG. 1A to FIG. 1P, one die is shown to represent plural dies of the wafer, and a package structure 10 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 1A, in some embodiments, a carrier 112 with a debond layer 114 and a bonding layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g. the bonding layer 116) or any wafer(s) disposed thereon. For example, the debond layer 114 may include a release layer (such as a light-to-heat conversion ("LTHC") layer) or an adhesive layer (such as a ultra-violet curable adhesive or a heat curable adhesive layer).

As shown in FIG. 1A, in some embodiments, the bonding layer 116 is disposed on the debond layer 114, and the debond layer 114 is located between the carrier 112 and the bonding layer 116. In some embodiments, the bonding layer 116 may be a dielectric adhesive layer made of a dielectric adhesive material having at least one epoxy group. In some embodiments, the bonding layer 116 may be a dielectric adhesive layer made of a dielectric adhesive material having at least one olefin group. In some embodiments, the bonding layer 116 may be a photosensitive adhesive layer made of a photosensitive adhesive material, such as polyimide, benzocyclobutene (BCB), SINR, or combinations thereof. In one embodiment, the bonding layer 116 may be formed, for example, by a spin coat method, a dip coat method or a suitable coating method. In some embodiments, the bonding layer 116 may be dispensed as a liquid and cured or may be a laminate film laminated onto the debond layer 114, or may be the like. The disclosure is not limited thereto. The top surface of the bonding layer 116 may be leveled and may have a high degree of coplanarity.

Referring to FIG. 1B, in some embodiments, the bonding layer 116 is patterned to form a bonding layer 116A having openings 116a1 and openings 116a2. In some embodiments, the openings 116a1 and the openings 116a2 respectively expose portions of the debond layer 114. In one embodiment, the bonding layer 116 may be patterned, for example, by photolithography process (e.g. including coating, pre-baking, exposing, developing, post-baking steps). In one embodiment, after patterning, the bonding layer 116A may be placed into an oven for fully curing, however the disclosure is not limited to the fully curing method. In the disclosure, the bonding layer 116A is a dielectric layer and is adherable under heat and pressure after fully curing or after semi-curing. For example, after fully curing, the bonding layer 116A is adherable under a temperature range of about 150° C. to about 300° C. and a pressure range of about 2 bar to about 20 bar.

For example, in FIG. 1B, only two openings 116a1 and only two openings 116a2 are shown, however the disclosure is not limited thereto. The number of the openings 116a1 and/or openings 116a2 may be one or more than one depending on the demand. Additionally, for example, a dimension (e.g. a maximum width) of the openings 116a2 is greater than a dimension (e.g. a maximum width) of the openings 116a1, as shown in FIG. 1B, however the disclosure is not limited thereto. In an alternative embodiment, according to the design layout, the dimension (e.g. a maximum width) of the openings 116a2 may be less than or substantially equal to the dimension (e.g. a maximum width) of the openings 116a1. In one embodiment, along a direction perpendicular to a stacking direction of the carrier 112 and the debond layer 114, a cross-sectional shape of the openings 116a1 and/or the openings 116a2 may be round, elliptical, oval, tetragonal, octagonal or any suitable polygonal shape, and the shape of the openings 116a2 may be the same or different from the shape of the openings 116a1. In some embodiments, the openings 116a1 and the openings 116a2 may be formed in the same patterning step; however, the disclosure is not limited thereto. In an alternative embodiment, the openings 116a1 and the openings 116a2 may be formed in different patterning steps.

Referring to FIG. 1C, in some embodiments, at least one die 120 is provided and disposed on the bonding layer 116A. For example, the die 120 may be picked and placed on the bonding layer 116A, however the disclosure is not limited thereto. In some embodiments, the die 120 includes an active surface 120t, a plurality of contact pads 121 distributed on the active surface 120t, a bonding layer 123 covering the active surface 120t and a portion of the contact pads 121, and a backside surface 120b opposite to the active surface 120t, where the contact pads 121 are partially exposed by openings 125 formed in the bonding layer 123. As shown in FIG. 1C, for example, the contact pads 121 are partially exposed by openings 125 formed in the bonding layer 123. In some embodiments, the contact pads 121 may be aluminum pads or other suitable metal pads. In some embodiments, a material of the bonding layer 123 is the same as the material of the bonding layer 116/116A described in FIG. 1A and FIG. 1B, thus may not be repeated herein.

It is noted that, the die 120 described herein may be referred as a chip or an integrated circuit (IC). In an alternative embodiment, the die 120 described herein may be semiconductor devices. In certain embodiments, the die 120 may include one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the die 120 may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto.

As shown in FIG. 1C, in some embodiments, the die 120 is disposed on the bonding layer 116A by directly contacting the bonding layer 123 with the bonding layer 116A, where the bonding layer 123 and the bonding layer 116A are adhered by heating and pressing. That is, by applying heat and pressure, the die 120 and the bonding layer 116A are adhered to each other and bonded through the bonding layer 123, and a good adhesion between the die 120 and the bonding layer 116A is ensured. In certain embodiments, the contact pads 121 of the die 120 are exposed by the opening 125 formed in the bonding layer 123 of the die 120 and the opening 116a2 formed in the bonding layer 116A, where the openings 125 and the openings 116a2 are spatially communicated to each other, so that the contact pads 121 exposed by the openings 125 are also exposed by the openings 116a2, respectively.

Referring to FIG. 1D, in some embodiments, a seed layer 132 are formed over the carrier 112. For example, the seed layer 132 is formed on the die 120 and the bonding layer 116A to cover a sidewall and a backside surface 120b of the die 120 and a surface of the bonding layer 116A exposed by the die 120. In certain embodiments, the seed layer 132 extends into the openings 116a1 formed in the bonding layer 116A and in contact with the debond layer 114 exposed by the openings 116a1. In other words, the seed layer 132 penetrates through the bonding layer 116A and physically contacts the debond layer 114, and sidewalls of the openings 116a1 are completely covered by the seed layer 132. In some embodiments, the seed layer 132 is formed over the carrier 112 in a manner of a blanket layer made of metal or metal alloy materials, the disclosure is not limited thereto. In some embodiments, the seed layer 132 are referred as a metal layer, which may be a single layer or a composite layer comprising a plurality of sub-layers formed of different materials. In some embodiments, the seed layer 132 may include titanium, copper, molybdenum, tungsten, titanium nitride, titanium tungsten, combinations thereof, or the like. For example, the seed layer 132 may include a titanium layer and a copper layer over the titanium layer. The seed layer 132 may be formed using, for example, sputtering, physical vapor deposition (PVD). or the like. In some embodiments, the seed layer 132 may be conformally formed on the debond layer 114, the bonding layer 116A and the die 120 by sputtering, and in contact the die 120, a portion of the bonding layer 116A exposed by the die 120, and a portion of debond layer 114 exposed by the bonding layer 116A.

Referring to FIG. 1E, in some embodiments, a patterned photoresist layer PR1 is formed on the seed layer 132, wherein the patterned photoresist layer PR1 includes at least one opening O1. In some embodiments, a plurality of openings O1 are formed in the patterned photoresist layer PR1. In one embodiment, the patterned photoresist layer PR1 may be formed by coating and photolithography processes or the like. The number of the openings O1 may, for example, correspond to the number of later-formed conductive structure(s) (such as a conductive pillar). However, the disclosure is not limited thereto. As shown in FIG. 1E, portions of the seed layer 132 are exposed by the openings O1 formed in the patterned photoresist layer PR1, respectively. In some embodiments, a material of the patterned photoresist layer PR1, for example, includes a positive resist material or a negative resist material, that is suitable for a patterning process such as a photolithography process with a mask or a mask-less photolithography process (for instance, an electron-beam (e-beam) writing or an ion-beam writing).

Referring to FIG. 1F, in some embodiments, conductive pillars 140 are formed in the openings O1, respectively. In certain embodiments, the conductive pillars 140 may be through integrated fan-out (info) vias. In some embodiments, the conductive pillars 140 are arranged along but not on a cutting line (not shown) between two package structures 10. In some embodiments, the conductive pillars 140 are formed by plating process or any other suitable method, which the plating process may include electroplating or electroless plating, or the like. In one embodiment, the conductive pillars 140 may be formed by forming a metallic material filling the openings to form the conductive pillars 140 by electroplating or deposition. In one embodiment, the material of the conductive pillars 140 may include a metal material such as copper or copper alloys, or the like. For example, as shown in FIG. 1F, the height of the conductive pillars 140 may be greater than the height of the die 120. However, the disclosure is not limited thereto; in an alternative embodiment, the height of the conductive pillars 140 may be less than or substantially equal to the height of the die 120. For simplification, only two conductive pillars 140 are presented in FIG. 1E for illustrative purposes, however, it should be noted that more than two conductive pillars may be formed; the disclosure is not limited thereto. The number of the conductive pillars can be selected based on the demand.

Referring to FIG. 1F and FIG. 1G, in some embodiments, after the conductive pillars 140 are formed, the patterned photoresist layer PR1 is removed and a patterned photoresist layer PR2 is formed on the seed layer 132 and the conductive pillars 140. In one embodiment, the patterned photoresist layer PR1 is removed by acceptable aching process and/or photoresist stripping process, such as using an oxygen plasma or the like. The disclosure is not limited thereto. In some embodiments, the patterned photoresist layer PR2 includes at least one opening O2. As shown in FIG. 1G, a plurality of openings O2 are formed in the patterned photoresist layer PR2 to respectively expose portions of the seed layer 132, which the conductive pillars 140 are covered by the patterned photoresist layer PR2. In one embodiment, the patterned photoresist layer PR2 may be formed by photolithography process. The number of the openings O2 may, for example, be corresponding to the number of later-formed conductive structure(s) (such as a conductive via or a conductive pillar). However, the disclosure is not limited thereto. As shown in FIG. 1E, the seed layer 132 is partially exposed by the openings O2 formed in the patterned photoresist layer PR2, and the conductive pillars 140 are respectively surrounded by but not exposed by the openings O2. In one embodiment, the materials and formation methods of the patterned photoresist layer PR1 and the patterned photoresist layer PR2 may be the same, however the disclosure is not limited thereto.

Referring to FIG. 1G and FIG. 1H, in some embodiments, after the patterned photoresist layer PR2 having the openings O2 are formed, the seed layer 132 is patterned to form a seed layer 132A having openings OP. As shown in FIG. 1H, in certain embodiments, the seed layer 124A includes a plurality of conductive segments which are mechanically and electrically isolated from one another. In some embodiments, the seed layer 132A is formed by removing the portions of the seed layer 132 exposed by the openings O2 formed in the patterned photoresist layer PR2. As shown in FIG. 1H, a first portion P1 of the seed layer 132A contacting the die 120 is mechanically separated and electrically isolated from a second portion P2 contacting the conductive pillars 140 by the openings OP. In some embodiments, the openings OP exposes portions of the bonding layer 116A, respectively. In some embodiments, after forming the seed layer 132A, the patterned photoresist layer PR2 is removed. In one embodiment, the removal methods of the patterned photoresist layer PR1 and the patterned photoresist layer PR2 may be the same, however the disclosure is not limited thereto.

Referring to FIG. 1I, in some embodiments, the insulating encapsulation 150 is formed over the carrier 112, where the die 120, the seed layer 132A and the conductive pillars 140 are encapsulated in the insulating encapsulation 150. In some embodiments, the insulating encapsulation 150 at least fills up the gaps between the die 120 and the conductive pillars 140 and the openings OP formed in the seed layer 132A. For example, as shown in FIG. 1I, the insulating encapsulation 150 covers the bonding layer 116A, the die 120, the seed layer 132A and the conductive pillars 140, where the bonding layer 116A, the die 120 and the seed layer 132A are not accessibly revealed by the insulating encapsulation 150, and bottom surfaces 140b of the conductive pillars 140 are exposed by the insulating encapsulation 150. In other words, the insulating encapsulation 150 is overmolded over the die 120, where a height of the insulating encapsulation 150 is greater than heights of the die 120, and the seed layer 132A and a portion of the bonding layer 116A exposed by the seed layer 132A are covered by the insulating encapsulation 150. As shown in FIG. 1I, in some embodiments, sidewalls of the conductive pillars 140 are surrounded and covered by the insulating encapsulation 150, and bottom surfaces 140b of the conductive pillars 140 are exposed by a bottom surface 150b of the insulating encapsulation 150. For example, the bottom surfaces 140b of the conductive pillars 140 are substantially leveled with the bottom surface 150b of the insulating encapsulation 150, as shown in FIG. 1I. That is, the bottom surfaces 140b of the conductive pillars 140 are substantially coplanar to the bottom surface 150b of the insulating encapsulation 150.

In some embodiments, the insulating encapsulation 150 may also be over-molded over the conductive pillars 140, where a height of the insulating encapsulation 150 is greater than heights of the conductive pillars 140. A planarizing process may, for example, performed on the over-molded insulating encapsulation 150 to level the bottom surface 150b of the insulating encapsulation 150 and the bottom surfaces 140b of the conductive pillars 140. In some embodiments, in the mentioned planarizing process, portions of the conductive pillars 140 may be removed, for example. The disclosure is not limited thereto.

In one embodiment, the material of the insulating encapsulation 150 includes epoxy resins, phenolic resins or silicon-containing resins, or any suitable materials, for example. In an alternative embodiment, the insulating encapsulation 150 may include an acceptable insulating encapsulation material. In some embodiments, the insulating encapsulation 150 may further include inorganic filler or inorganic compound (e.g. silica, clay, and so on) which can be added therein to optimize coefficient of thermal expansion (CTE) of the insulating encapsulation 150. The disclosure is not limited thereto.

Referring to FIG. 1J, in some embodiments, the whole package structure 10 is flipped and bonded onto a carrier 212, where the carrier 112 is debonded. In certain embodiments, the whole package structure 10 flipped along with the carrier 112 is flipped (turned upside down) and then the carrier 112 is debonded from the bonding layer 116A. In some embodiments, the bonding layer 116A is easily separated from the carrier 112 due to the debond layer 114. In some embodiments, the carrier 112 is detached from the bonding layer 116A through a debonding process, and the carrier 112 and the debond layer 114 are removed. In certain embodiments, the bonding layer 116A and the contact pads 121 and the bonding layer 123 of the die 120 exposed by the openings 116a2 of the bonding layer 116A are exposed, as show in FIG. 1J.

In one embodiment, the debonding process is a laser debonding process. During the debonding step, a holding device (not shown) may be adopted to secure the package structures 10 before debonding the carrier 112 and the debond layer 114. For example, the holding device may be an adhesive tape, a carrier film or a suction pad. The disclosure is not limited thereto.

As shown in FIG. 1I, the conductive pillars 140 and the insulating encapsulation 150 are bonded onto a carrier 212, as shown in FIG. 1I. In some embodiments, the carrier 212 is coated with a debond layer 214. The material of the debond layer 214 may be any material suitable for achieving an easy debonding between the carrier 212 and the above layers disposed thereon. In some embodiments, the materials of the debond layer 214 and the debond layer 114 may be the same. In an alternative embodiment, the material of the debond layer 214 may be different from the material of the debond layer 114.

In some embodiments, the material of the carrier 212 may include a bare silicon substrate. In an alternative embodiment, the carrier 212 may be a bulk silicon substrate, such as a bulk substrate of monocrystalline silicon. The disclosure is not limited thereto. In some embodiments, the material of the carrier 212 may be the same as that of the carrier 112. In an alternative embodiment, the material of the carrier 212 may be different from that of the carrier 112.

Referring to FIG. 1K, in some embodiments, a seed layer 134 is formed on the bonding layer 116A, the contact pads 121 and the bonding layer 123 of the die 120, and the seed layer 132A. In other words, the seed layer 134 is formed on the bonding layer 116A and the seed layer 132A by directly contacting the bonding layer 116A and the seed layer 132A and extends into the openings 116a2 formed in the bonding layer 116A and the openings 125 formed in the bonding layer 123, where sidewalls and bottom surfaces of the openings 116a2 and the openings 125 are covered by and in physical contact with the seed layer 134. As shown in FIG. 1K, the seed layer 134 is formed over the carrier 212 as a blanket layer. The formation methods and materials of the seed layer 134 are similar to the processes and materials for forming the seed layer 132 as described in FIG. 1D may not be repeated herein.

Continued on FIG. 1K, in some embodiments, a patterned photoresist layer PR3 is formed on the seed layer 134, wherein the patterned photoresist layer PR3 includes at least one opening O3. In some embodiments, a plurality of openings O3 are formed in the patterned photoresist layer PR3, where each of the openings O3 is spatially communicated to a respective one of the openings 116a2 and a respectively one of the openings 125. In one embodiment, the patterned photoresist layer PR3 may be formed by coating and photolithography processes or the like. The number of the openings O3 may, for example, correspond to the number of later-formed conductive structure(s) (such as a conductive via or a conductive structure). However, the disclosure is not limited thereto. As shown in FIG. 1K, portions of the seed layer 134 are respectively exposed by the openings O3 formed in the patterned photoresist layer PR3, where the seed layer 134 exposed by the openings O3 formed in the patterned photoresist layer PR3 are located inside the openings 116a2 and the openings 125. In one embodiment, as shown in FIG. 1K, an outer sidewall of the seed layer 134 is aligned with a sidewall of a respective one of the openings O3, in which a size of the openings 116a is greater than a size of the openings 125 and a size of the openings O3, and the size of the openings 125 is less than the size of the openings O3. However, the disclosure is not limited thereto.

Referring to FIG. 1L, in some embodiments, at least one conductive structure M0 is formed. In some embodiments, a plurality of conductive structures M0 are formed on the portions of the seed layer 134 exposed by the openings O3 (depicted in FIG. 1K), the opening 116a2, and the openings 125. In one embodiment, the conductive structures M0 may be formed by plating process or any other suitable method, which the plating process may include electroplating or electroless plating, or the like. In one embodiment, the conductive structures M0 may be formed by forming a metallic material filling the openings to form the conductive structures M0 by electroplating or deposition. In one embodiment, the material of the conductive structures M0 may include a metal material such as copper or copper alloys, or the like. For simplification, only two conductive structures M0 are presented in FIG. 1L for illustrative purposes, however, it should be noted that more than two conductive structures may be formed; the disclosure is not limited thereto. The number of the conductive structures can be selected based on the demand. It is noted that the number of the conductive structures M0 is corresponding to the number of the openings O3.

Referring to FIG. 1M, in some embodiments, a planarizing process is performed to remove a portion of the seed layer 134 to form a seed layer 134A. As shown in FIG. 1M, in certain embodiments, the seed layer 134A includes a plurality of conductive segments which are mechanically and electrically isolated from one another. In some embodiments, a portion of the seed layer 134 is removed to expose portions of the bonding layer 116A, where a surface 134t of the seed layer 134A is substantially leveled with a top surface 116t of the bonding layer 116A. In other words, the surface 134t of the seed layer 134A is substantially coplanar to the top surface 116t of the bonding layer 116A, so that the seed layer 134A is not covered the top surface 116t of the bonding layer 116A. During the planarizing process, portions of the seed layer 132A and/or the conductive structures M0 are also removed, where a surface 132t of the seed layer 132A, top surfaces M0t of the conductive structures M0, and top surfaces 140t of the conductive pillars 140 are substantially leveled with the surface 134t of the seed layer 134A and the top surface 116t of the bonding layer 116A. In other words, the surface 132t of the seed layer 132A, the top surfaces M0t of the conductive structures M0, and the top surfaces 140t of the conductive pillars 140 are substantially coplanar to the surface 134t of the seed layer 134A and the top surface 116t of the bonding layer 116A. In one embodiment, portions of the conductive pillars 140 may also be removed during the planarizing process, the disclosure is not limited thereto.

In some embodiments, the bonding layer 116A, the seed layer 132A, the seed layer 134, the conductive structures M0 and/or the conductive pillars 140 are planarized through a grinding process or a chemical mechanical polishing (CMP) process. After the planarizing process, a cleaning step may be optionally performed, for example to clean and remove the residue generated from the planarizing process. However, the disclosure is not limited thereto, and the planarizing process may be performed through any other suitable method. The disclosure is not limited thereto.

Referring to FIG. 1N, in some embodiments, after the planarizing process, a redistribution layer 160 is formed on the top surface 116t of the bonding layer 116A, the surface 132t of the seed layer 132A, the top surfaces 140t of the conductive pillars 140, the surface 134t of the seed layer 134A, and the top surfaces M0t of the conductive structures M0. In some embodiments, the redistribution layer 160 is mechanically and electrically connected to the seed layer 132A, the conductive pillars 140, the seed layer 134A, and the conductive structures M0. As shown in FIG. 1N, in some embodiments, the redistribution layer 160 is electrically connected to the die 120 through the conductive structures M0 and the contact pads 121, and is electrically connected to the conductive pillars 140 by directly contacting, where the redistribution layer 160 provides a routing function for the die 120. In some embodiments, the redistribution layer 160 is a front-side redistribution layer electrically connected to the die 120.

In some embodiments, the formation of the redistribution layer 160 includes sequentially forming one or more dielectric layers DI and one or more metallization layers M1 in alternation. In certain embodiments, as shown in FIG. 1N, the metallization layers M1 are sandwiched between the dielectric layers DI, where the top surface of the topmost layer of the metallization layers M1 is exposed by the topmost layer of the dielectric layers DI and the lowest layer of the metallization layers M1 is exposed by the lowest layer of the dielectric layers DI to connect the conductive structures M0 for electrically connecting to the die 120. In some embodiments, the material of the dielectric layers DI includes polyimide, acrylic resin, phenol resin, benzocyclobutene (BCB), polybenzoxazole (PBO), or any other suitable dielectric material, and the dielectric layers DI may be formed by coating. In some embodiments, the material of the metallization layers M1 includes aluminum, titanium, copper, nickel, tungsten, and/or alloys thereof, and the metallization layers M1 may be formed by electroplating or deposition. The numbers of the metallization layers and the dielectric layers included in the redistribution layer 160 is not limited according to the disclosure.

Continued on FIG. 1N, the redistribution layer 160 further includes one or more seed layers 136A. In some embodiments, each of the seed layer 136A is located between a respective one of the dielectric layer DI and a respective one of the metallization layer M1, such that the respective one of the metallization layer M1 is separated from the respective one of the dielectric layers DI by one of the seed layers 136A. In some embodiments, the material of the seed layer 136A is the same as the materials of the seed layer 132A and/or the seed layer 134A. In on embodiment, the material of the seed layer 135A is different from the materials of the seed layer 132A and/or the seed layer 134A. The disclosure is not limited thereto.

In one embodiment, a dielectric material layer (not shown) is formed as a blanket layer over the bonding layer 116A, the seed layer 132A, the conductive pillars 140, the seed layer 134A and the conductive structures M0 by coating and is patterned to from a patterned dielectric layer (e.g. one layer of the dielectric layers DI), a conductive material layer is conformally formed as a blanket layer over the patterned dielectric layer by plating or deposition, a patterned photoresist layer is formed to cover a portion of the conductive material layer, a metallization material layer is formed on the conductive material layer exposed by the patterned photoresist layer by plating process, the patterned photoresist layer is then removed, and the metallization material layer, the conductive material layer, and/or the patterned dielectric layer are planarized so as to form a patterned conductive material layer (e.g. one layer of the seed layers 136A) and a patterned metallization material layer (e.g. one layer of the metallization layers M0, where the aforementioned steps may be repeated at least two time to form the redistribution layer 160 depicted in FIG. 1N. However, the disclosure is not limited thereto, in an alternative embodiment, the redistribution layer 160 may formed by repeating aforementioned steps once or more than twice. In one embodiment, the formation, material, and removal of the patterned photoresist layer may be the same for different from that of the patterned photoresist layer PR1, the patterned photoresist layer PR2, and/or the patterned photoresist layer PR3. The disclosure is not limited thereto. In one embodiment, the seed layer 134A and the conductive structure M0 may be considered as a part of the redistribution layer 160. In some embodiments, the material of the bonding layer 116/116A are different from the material of the dielectric layer DI, however the disclosure is not limited thereto. In an alternative embodiment, the material of the bonding layer 116/116A are the same as the material of the dielectric layer DI.

As shown in FIG. 1N, the die 120 is stably adhered to the bonding layer 116A through the bonding layer 123 therebetween by heating and pressing, where the metallization layers M1 of the redistribution layer 160 are not directly formed on the insulating encapsulation 150 due to the bonding layer 116A. Since the redistribution layer 160 is directly formed on the bonding layer 116A, and the surface roughness of the bonding layer 116A where the redistribution layer 160 formed thereon has a much smaller surface roughness (e.g. less than 1 μm) as comparing to that of the planarized surface of a conventional insulating encapsulation (which is disposed with a redistribution layer); and thus, the redistribution layer 160 with fine pitch is achieved.

Referring to FIG. 1O, in some embodiments, a plurality of conductive elements 170 are formed on the redistribution layer 160. As shown in FIG. 1O, the conductive elements 170 are mechanically and electrically connected to the redistribution layer 160. In some embodiments, some of the conductive elements 170 are electrically connected to the die 120 through the redistribution layer 160 and the conductive structures M0. In some embodiments, some of the conductive elements 170 are electrically connected to the conductive pillars 140 through the redistribution layer 170. In some embodiments, the conductive elements 170 may be formed by ball placement process or reflow process. In some embodiments, the conductive elements 170 are, for example, solder balls or ball grid array (BGA) balls, chip connectors ("C4") or other connectors for connecting to an external device.

Continued on FIG. 1O, in some embodiments, at least one die 180 may be mounted on the redistribution layer 160. In some embodiments, the die 180 is disposed on the redistribution layer 160 by connectors 190 there-between. In some embodiments, the die 180 is connected to the topmost layer of the metallization layers M1 of the redistribution layer 160 through flip chip bonding technology. In one embodiment, the die 180 is joined to the redistribution layer 160 after the conductive elements 170 are disposed. In an alternative embodiment, the die 180 is joined to the redistribution layer 160 before the conductive elements 170 are disposed, the disclosure is not limited thereto. In some embodiments, the die 180 may include integrated passive components (IPDs) such as capacitors, resistors, inductors, and transducers, or the die 180 may be a voltage regulator chip, a sensor chip, a memory chip or the like. In some embodiments, the connectors 190 may include solder balls, solder bumps or the like, the disclosure is not limited thereto. In some embodiments, the die 180 may be electrically connected to the die 120 through the connectors 190, the redistribution layer 160 and the conductive structures M0. In some embodiments, the die 180 may be electrically connected to the conductive pillars 140 through the connectors 190 and the redistribution layer 160. In some embodiments, some of the conductive elements 170 are electrically connected to the die 180 through the redistribution layer 160 and the connectors 190.

As shown in FIG. 1O, for example, an underfill material 200 is formed between the redistribution layer 160 and the die 180 and dispensed around the connectors 190. In some embodiments, the underfill material 200 at least fills the gaps between the connectors 190 and between the redistribution layer 160, the die 180 and the connectors 190. As shown in FIG. 1O, for example, the underfill material 200 is disposed on the redistribution layer 160 and wraps sidewalls of the connectors 190 to provide structural support and protection to the connectors 190. In some embodiments, a material of the underfill material 200 and the insulating encapsulation 150 may be the same or different, the disclosure is not limited thereto.

In some embodiments, prior to the formation of the conductive elements 170 and/or the die 180, a plurality of under-ball metallurgy (UBM) patterns (not shown) may be formed on the topmost layer of the metallization layers M1 exposed by the topmost layer of the dielectric layers DI for electrically connecting the conductive elements 170 and/or the die 180 to the redistribution layer 160. In some embodiments, the material of the UBM patterns may include copper, nickel, titanium, tungsten, or alloys thereof or the like, and may be formed by an electroplating process, for example. The number and material of the UBM patterns are not limited in the disclosure.

Referring to FIG. 1P, in some embodiments, the carrier 212 is debonded from the conductive pillars 140 and the insulating encapsulation 150 to form the package structure 10. The conductive pillars 140 and the insulating encapsulation 150 are easily separated from the carrier 212 due to the debond layer 214. In some embodiments, the conductive pillars 140 and the insulating encapsulation 150 are debonded from the carrier 212, and the bottom surfaces 140b of the conductive pillars 140 and the bottom surface 150b of the insulating encapsulation 150 are exposed. Up to here, the manufacture of the package structures 10 is completed.

During the debonding step, for example, the package structure 10 is flipped along with the carrier 212, and a holding device (not shown) is adopted to secure the package structure 10 before debonding the carrier 212 and the debond layer 214, where the conductive elements 170 are held by the holding device. For example, the holding device may be an adhesive tape, a carrier film or a suction pad. In some embodiments, prior to releasing the conductive elements 170 from the holding device, the carrier 212 is debonded and the dicing process is then performed to cut the wafer having a plurality of the packages structures 10 into individual and separated packages structures 10. In one embodiment, the dicing process is a wafer dicing process including mechanical blade sawing or laser cutting.

In some embodiments, the package structure 10 may be further mounted with an additional package, chips/dies or other electronic devices to form a package-on-package (POP) structure. For example, the package structure 10 may be further mounted with an additional package, chips/dies or other electronic devices to form the POP structure through the conductive pillars 140 and/or other additional connectors based on the demand.

However, the disclosure is not limited thereto, in an alternative embodiment, the carrier 212 may be remained on the conductive pillars 140 and the insulating encapsulation 150 and is a part of the package structure 10. For example, as the material of the carrier 212 is a Si substrate, the carrier 212 may serve as a heat dissipating element for the package structure 10. In such embodiments, the carrier 212 may further be used for warpage control.

FIG. 2A to FIG. 2I are schematic cross-sectional views of various stages in a manufacturing method of a package structure according to some exemplary embodiments of the present disclosure. Referring to FIG. 1A to FIG. 1P and FIG. 2A to FIG. 2I together, the elements similar to or substantially the same as the elements described previously will use the same reference numbers, and certain details or descriptions (e.g. formation methods, materials, and so on) of the same elements may not be repeated herein.

In FIG. 2A to FIG. 2I, two dies are shown to represent plural dies of the wafer, and a package structure 20 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Figure 2A:
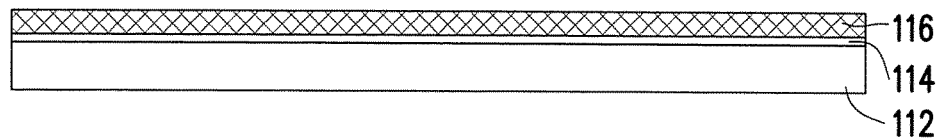
FIG. 2A to FIG. 2I are schematic cross-sectional views of various stages in a manufacturing method of a package structure according to some exemplary embodiments of the present disclosure.

Referring to FIG. 2A, in some embodiments, a carrier 112 with a debond layer 114 and a bonding layer 116 coated thereon is provided. In some embodiments, the debond layer 114 is disposed on the carrier 112, and the material of the debond layer 114 may be any material suitable for bonding and debonding the carrier 112 from the above layer(s) (e.g., the bonding layer 116) or any wafer(s) disposed thereon. As shown in FIG. 2A, in some embodiments, the bonding layer 116 is disposed on the debond layer 114, and the debond layer 114 is located between the carrier 112 and the bonding layer 116.

Figure 2B:
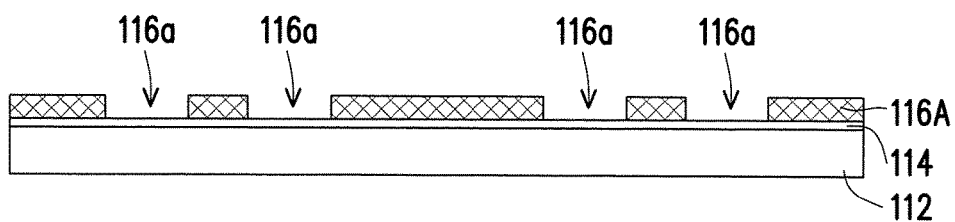

Referring to FIG. 2B, in some embodiments, the bonding layer 116 is patterned to form a bonding layer 116A having openings 116a. In some embodiments, the openings 116a respectively expose portions of the debond layer 114. In one embodiment, after patterning, the bonding layer 116A may be placed into an oven for fully curing, however the disclosure is not limited the fully curing method. In the disclosure, the bonding layer 116A is a dielectric layer and is adherable under heat and pressure after fully curing or semi-curing. For example, after fully curing, the bonding layer 116A is adherable under a temperature range of about 150° C. to about 300° C. and a pressure range of about 2 bar to about 20 bar. For example, in FIG. 2B, only four openings 116a are shown, however the disclosure is not limited thereto. The number of the openings 116a may be one or more than one depending on the demand. In one embodiment, along a direction perpendicular to a stacking direction of the carrier 112 and the debond layer 114, a cross-sectional shape of the openings 116a may be round, elliptical, oval, tetragonal, octagonal or any suitable polygonal shape.

Figure 2C:
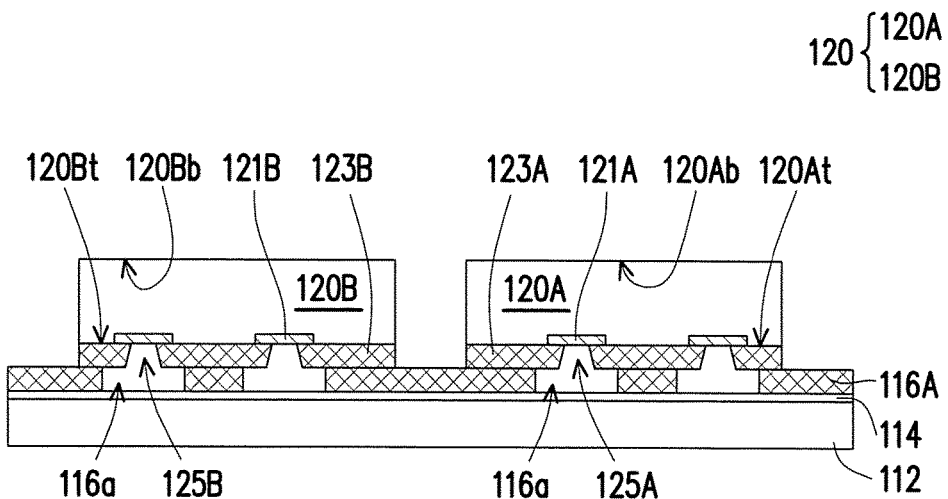

Referring to FIG. 2C, in some embodiments, at least one die 120 is provided and disposed on the bonding layer 116A. As shown in FIG. 2C, the die 120, for example, includes two dies, 120A and 120B. In some embodiments, the die 120A and the die 120B may be picked and placed on the bonding layer 116A, however the disclosure is not limited thereto. In one embodiment, by applying heat and pressure, the die 120A and the die 120B are adhered to and bonded on the bonding layer 116A, and a good adhesion between the die 120A and the bonding layer 116A and between the die 120B and the bonding layer 116A is ensured.

In some embodiments, the die 120A includes an active surface 120At, a plurality of contact pads 121A distributed on the active surface 120At, a bonding layer 123A covering the active surface 120At and a portion of the contact pads 121A, and a backside surface 120Ab opposite to the active surface 120At, where the contact pads 121A are partially exposed by openings 125A formed in the bonding layer 123A. As shown in FIG. 2C, for example, the contact pads 121A are partially exposed by openings 125A formed in the bonding layer 123A. As shown in FIG. 2C, in some embodiments, the die 120A is disposed on the bonding layer 116A by directly contacting the bonding layer 123A with the bonding layer 116A, where the bonding layer 123A and the bonding layer 116A are adhered by heating and pressing. In some embodiments, a material of the bonding layer 123A is the same as the material of the bonding layer 116/116A described in FIG. 1A and FIG. 1B, thus may not be repeated herein. In certain embodiments, the contact pads 121A of the die 120A are exposed by the opening 125A formed in the bonding layer 123A of the die 120A and the opening 116a formed in the bonding layer 116A, where the openings 125A and the openings 116a are spatially communicated to each other, so that the contact pads 121A exposed by the openings 125A are also exposed by the openings 116a, respectively.

In some embodiments, the die 120B includes an active surface 120Bt, a plurality of contact pads 121B distributed on the active surface 120Bt, a bonding layer 123B covering the active surface 120Bt and a portion of the contact pads 121B, and a backside surface 120Bb opposite to the active surface 120Bt, where the contact pads 121B are partially exposed by openings 125B formed in the bonding layer 123B. As shown in FIG. 2C, for example, the contact pads 121B are partially exposed by openings 125B formed in the bonding layer 123B. As shown in FIG. 2C, in some embodiments, the die 120B is disposed on the bonding layer 116A by directly contacting the bonding layer 123B with the bonding layer 116A, where the bonding layer 123B and the bonding layer 116A are adhered by heating and pressing. In some embodiments, a material of the bonding layer 123B is the same as the material of the bonding layer 116/116A described in FIG. 1A and FIG. 1B, thus may not be repeated herein. In certain embodiments, the contact pads 121B of the die 120B are exposed by the opening 125B formed in the bonding layer 123B of the die 120B and the opening 116a formed in the bonding layer 116A, where the openings 125B and the openings 116a are spatially communicated to each other, so that the contact pads 121B exposed by the openings 125B are also exposed by the openings 116a, respectively.

It is noted that, the die 120A and the die 120B described herein may be referred as a chip or an integrated circuit (IC). In an alternative embodiment, the die 120A and the die 120B described herein may be semiconductor devices. In certain embodiments, the die 120A and the die 120B may include one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the die 120A and the die 120B may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto. In one embodiment, the die 120A and the die 120B may be the same. In an alternative embodiment, the die 120A and the die 120B may be different, the disclosure is not limited thereto.

Figure 2D:
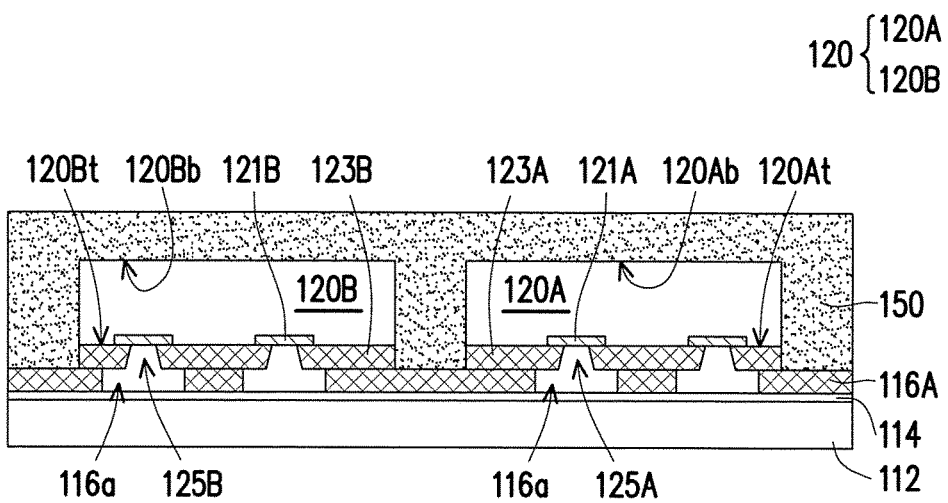

Referring to FIG. 2D, in some embodiments, the insulating encapsulation 150 is formed over the carrier 112, where the die 120A and the die 120B are encapsulated in the insulating encapsulation 150. In some embodiments, the insulating encapsulation 150 at least fills up the gaps between the die 120A and the die 120B and covers a portion of the bonding 116A exposed by the die 120A and the die 120B. For example, as shown in FIG. 2D, the die 120A, the die 120B, and the bonding layer 116A are not accessibly revealed by the insulating encapsulation 150. In other words, the insulating encapsulation 150 is over-molded over the die 120A and the die 120B, where a height of the insulating encapsulation 150 is greater than heights of the die 120A and the height of the die 120B.

Figure 2E:
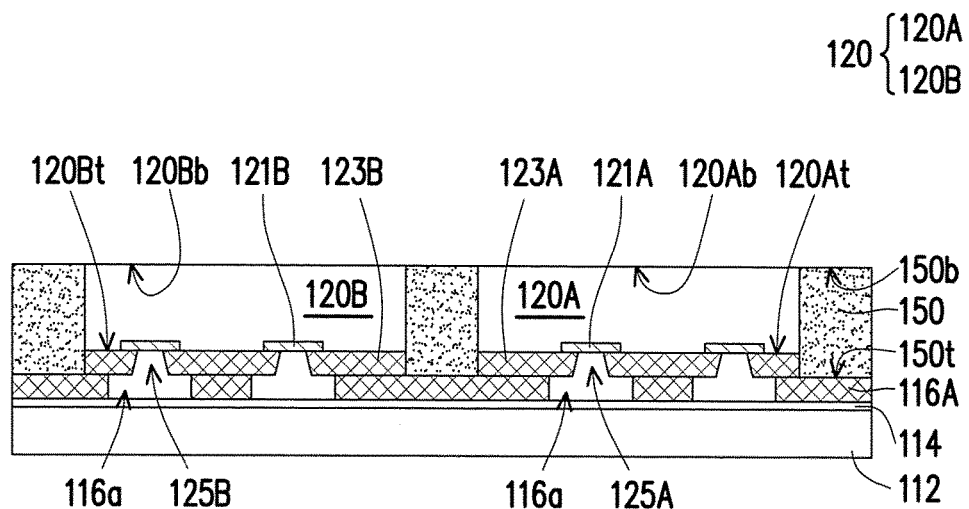

Referring to FIG. 2E, in some embodiments, a planarizing process is performed on the insulating encapsulation 150 until the bottom surface 120Ab of the die 120A and the bottom surface 120Bb of the die 120B being exposed by a bottom surface 150b of the insulating encapsulation 150. That is, after the planarizing process, the insulating encapsulation 150 is partially removed to expose the die 120A and the die 120B. In certain embodiments, after the planarizing process, the bottom surface 120Ab of the die 120A and the bottom surface 120Bb of the die 120B become substantially leveled with and coplanar to the bottom surface 150b of the insulating encapsulation 150. As shown in FIG. 2E, the top surface 150t of the insulating encapsulation 150 is substantially leveled with and coplanar to a surface of the bonding layer 123A and a surface of the bonding layer 123B.

During the planarizing process, a portion of the die 120A and a portion of the die 120B may also be removed. In some embodiments, the planarizing process may include a grinding process, fly cutting process, or a chemical mechanical polishing (CMP) process. After the planarizing process, a cleaning step may be optionally performed, for example to clean and remove the residue generated from the planarizing process. However, the disclosure is not limited thereto, and the planarizing process may be performed through any other suitable method.

Figure 2F:
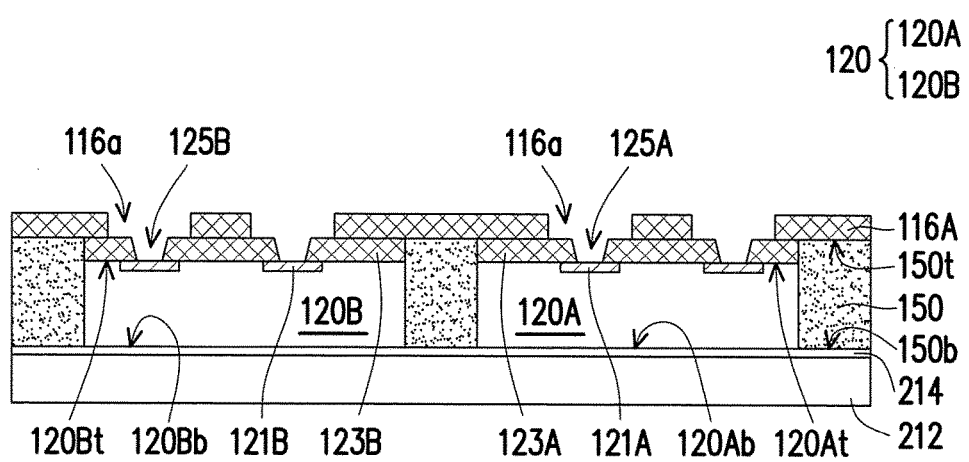

Referring to FIG. 2F, in some embodiments, the whole package structure 20 is flipped and bonded onto a carrier 212, where the carrier 112 is debonded. In certain embodiments, the whole package structure 20 flipped along with the carrier 112 is flipped (turned upside down) and then the carrier 112 is debonded from the bonding layer 116A. In some embodiments, the bonding layer 116A is easily separated from the carrier 112 due to the debond layer 114. In some embodiments, the carrier 112 is detached from the bonding layer 116A through a debonding process, and the carrier 112 and the debond layer 114 are removed. In certain embodiments, the bonding layer 116A, the contact pads 121A and the bonding layer 123A of the die 120A, and the contact pads 121B and the bonding layer 123B of the die 120B exposed by the openings 116a of the bonding layer 116A are exposed, as shown in FIG. 2F.

During the debonding step, a holding device (not shown) may be adopted to secure the package structures 20 before debonding the carrier 112 and the debond layer 114. For example, the holding device may be an adhesive tape, a carrier film or a suction pad. The disclosure is not limited thereto. In some embodiments, as shown in FIG. 2F, the die 120A, the die 120B, and the insulating encapsulation 150 are placed on the carrier 212 coated with a debond layer 214. For example, in FIG. 2F, the bottom surface 120Ab of the die 120A, the bottom surface 120Bb of the die 120B, and the bottom surface 150b of the insulating encapsulation 150 are directly connected to the debond layer 214.

Figure 2G:
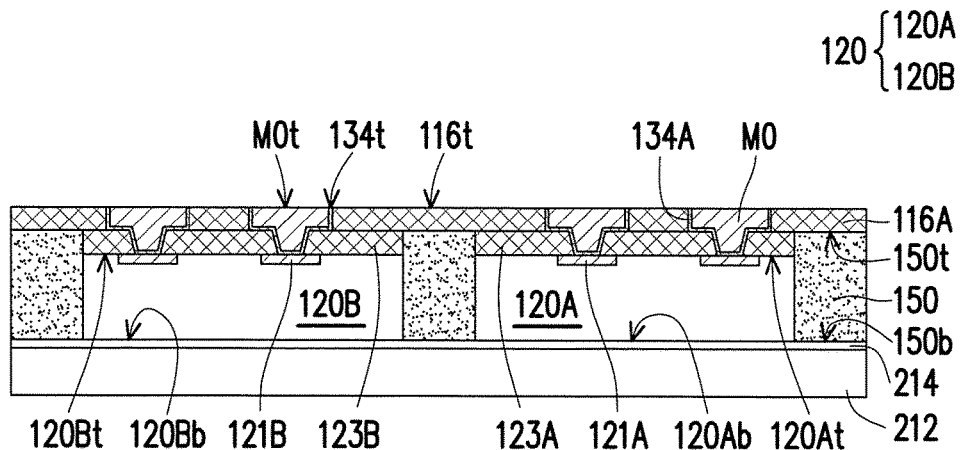

Referring to FIG. 2G, in some embodiments, a seed layer 134A is formed to mechanically and electrically connected to the contact pads 121A of the die 120A and the contact pads 121B of the die 120B, and conductive structures M0 are formed on the seed layer 134A to electrically connected to the contact pads 121A of the die 120A and the contact pads 121B of the die 120B through the seed layer 134A. The formations and materials of the seed layer 134A and the conductive structures M0 are described in FIG. 1K to FIG. 1M, thus may not be repeated herein. In some embodiments, in FIG. 2G, a surface 134t of the seed layer 134A and top surfaces M0t of the conductive structures M0 are substantially leveled with the top surface 116t of the bonding layer 116A. In other words, the surface 134t of the seed layer 134A and the top surfaces M0t of the conductive structures M0 are substantially coplanar to the top surface 116t of the bonding layer 116A.

Figure 2H:
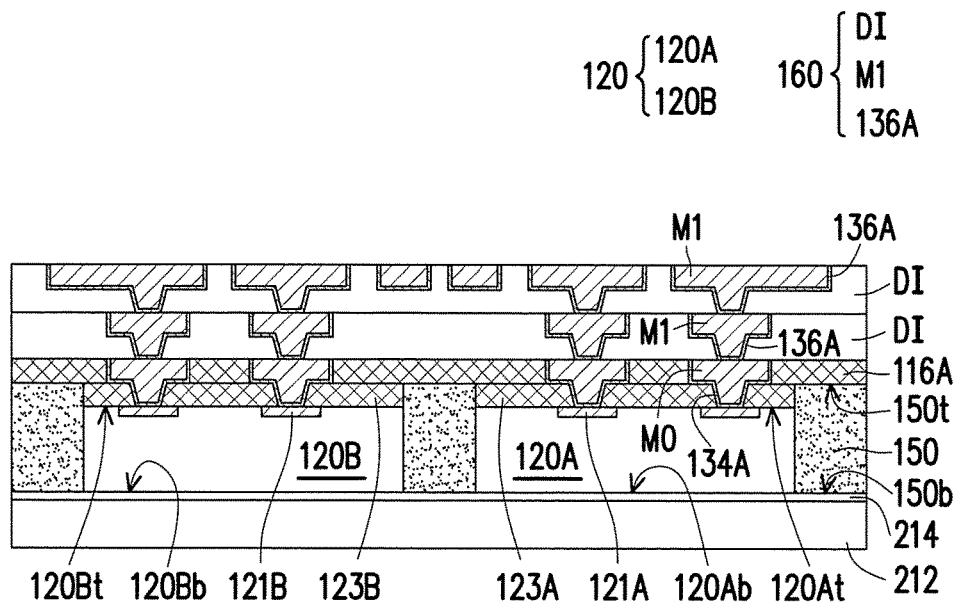

Referring to FIG. 2H, in some embodiments, a redistribution layer 160 is formed on the bonding layer 116A. In some embodiments, the redistribution layer 160 is formed on the top surface 116t of the bonding layer 116A, the surface 134t of the seed layer 134A, and the top surfaces M0t of the conductive structures M0. In some embodiments, the redistribution layer 160 is mechanically and electrically connected to the seed layer 134A and the conductive structures M0. As shown in FIG. 2H, the redistribution layer 160 is electrically connected to the die 120A through the conductive structures M0 and the contact pads 121A, and is electrically connected to the die 120B through the conductive structures M0 and the contact pads 121B, where the redistribution layer 160 provides a routing function for the die 120A and the die 120B. In some embodiments, the redistribution layer 160 is a front-side redistribution layer electrically connected to the die 120A and the die 120B. As shown in FIG. 2H, the die 120A and the die 120B are stably adhered to the bonding layer 116A through the bonding layer 123A and bonding layer 123B there-between by heating and pressing, where the metallization layers M1 of the redistribution layer 160 are not directly formed on the insulating encapsulation 150 due to the bonding layer 116A. Since the redistribution layer 160 is directly formed on the bonding layer 116A, and the surface roughness of the bonding layer 116A where the redistribution layer 160 formed thereon has a much smaller surface roughness (e.g. less than 1 µm) as comparing to that of the planarized surface of a conventional insulating encapsulation (which is disposed with a redistribution layer); and thus, the redistribution layer 160 with fine pitch is achieved.

In some embodiments, the redistribution layer 160 includes one or more dielectric layers DI and one or more metallization layers M1 arranged in alternation and one or more seed layers 136A located therebetween. In one embodiment, the seed layer 134A and the conductive structure M0 may be considered as a part of the redistribution layer 160. The numbers of the metallization layers, the seed layers, and the dielectric layers included in the redistribution layer 160 is not limited according to the disclosure. The formations and materials of the dielectric layers DI, the seed layer 136A, and the metallization layers M1 are described in FIG. 1N, thus may not be repeated herein.

Figure 2I:
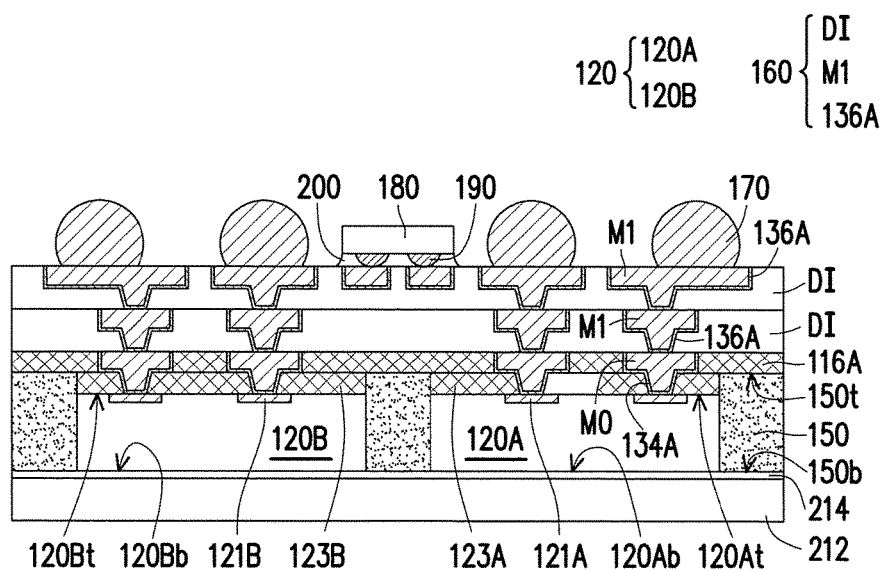

Referring to FIG. 2I, in some embodiments, a plurality of conductive elements 170 are formed to connect the redistribution layer 160. As shown in FIG. 2I, the conductive elements 170 are mechanically and electrically connected to the redistribution layer 160. In some embodiments, some of the conductive elements 170 are electrically connected to the die 120A through the redistribution layer 160 and the conductive structures M0. In some embodiments, some of the conductive elements 170 are electrically connected to the die 120B through the redistribution layer 160 and the conductive structures M0.

In some embodiments, as shown in FIG. 2I, at least one die 180 may be mounted on the redistribution layer 160. In some embodiments, the die 180 is disposed on the redistribution layer 160 by connectors 190 there-between. In some embodiments, the die 180 may be electrically connected to the die 120A through the connectors 190, the redistribution layer 160 and the conductive structures M0. In some embodiments, the die 180 may be electrically connected to the die 120B through the connectors 190, the redistribution layer 160 and the conductive structures M0. In some embodiments, some of the conductive elements 170 are electrically connected to the die 180 through the redistribution layer 160 and the connectors 190.

In some embodiments, as shown in FIG. 2I, an underfill material 200 is formed between the redistribution layer 160 and the die 180 and dispensed around the connectors 190. In some embodiments, the underfill material 200 at least fills the gaps between the connectors 190 and between the redistribution layer 160, the die 180 and the connectors 190. As shown in FIG. 2I, for example, the underfill material 200 is disposed on the redistribution layer 160 and wraps sidewalls of the connectors 190 to provide structural support and protection to the connectors 190. In some embodiments, prior to the formation of the conductive elements 170 and/or the die 180, a plurality of UBM patterns (not shown) may be formed on the topmost layer of the metallization layers M1 exposed by the topmost layer of the dielectric layers DI for electrically connecting the conductive elements 170 and/or the die 180 to the redistribution layer 160.

Up to here, the manufacture of the package structures 20 is completed. In some embodiments, a dicing process is performed to cut the wafer having a plurality of the package structures 20 into individual and separated package structures 20 without debonding the carrier 212, and the carrier 212 may serve as a heat dissipating element for the package structure 20. In some embodiments, the carrier 212 is further used for controlling the warpage of the package structures 20. In one embodiment, the dicing process is a wafer dicing process including mechanical blade sawing or laser cutting.

In an alternative embodiment, the carrier 212 may be debonded from the die 120A, the die 120B and the insulating encapsulation 150 before the dicing process; however, the disclosure is not limited thereto. In such embodiment, the package structure 20 may be further mounted with an additional package, chips/dies or other electronic devices to form a stacked package structure. For example, based on the demand, the package structure 20 may be further mounted with an additional package, chips/dies or other electronic devices to form the stacked package structure through additional elements, such as conductive pillars (similar to the conductive pillars 140 depicted in FIG. 1P) and/or connectors.

Figure 3:
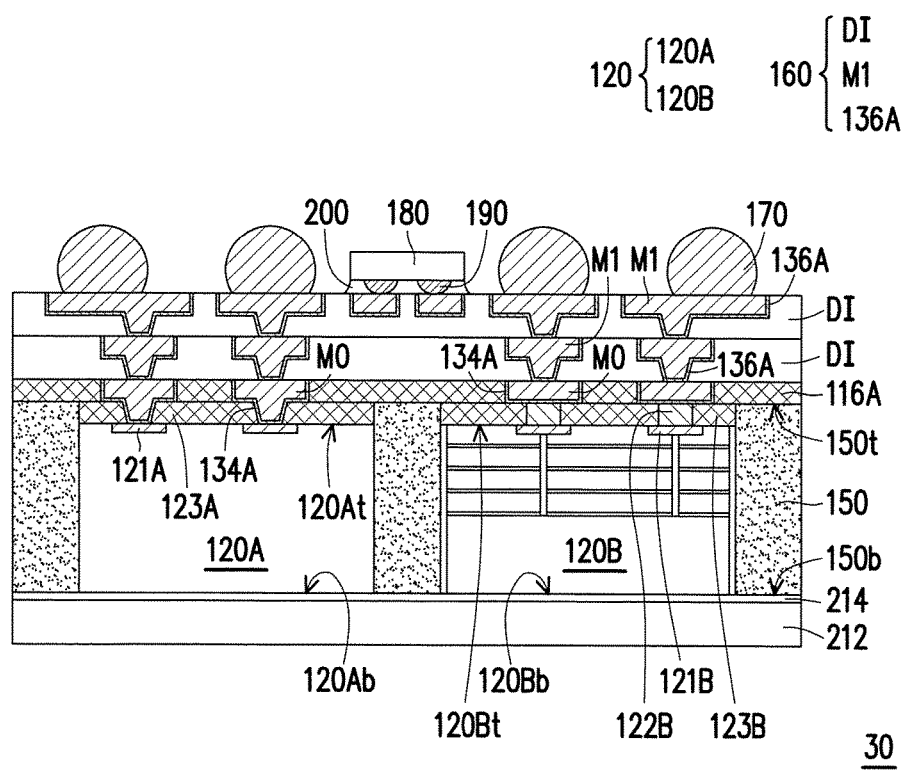
FIG. 3 is a schematic cross-sectional view of a package structure according to some exemplary embodiments of the present disclosure.

FIG. 3 is a schematic cross-sectional view of a package structure according to some exemplary embodiments of the present disclosure. Referring to FIG. 2I and FIG. 3 together, the package structure 20 depicted in FIG. 2I and the package structure 30 depicted in FIG. 3 are similar; such that the elements similar to or substantially the same as the elements described above will use the same reference numbers, and certain details or descriptions of the same elements and the relationship thereof (e.g. the relative positioning configuration and electrical connection, formation methods, materials, and so on) will not be repeated herein. In FIG. 3, two dies are shown to represent plural dies of the wafer, and a package structure 30 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 2I and FIG. 3 together, the difference is that, for the package structure 30 depicted in FIG. 3, the die 120A is different from the die 120B. As shown in FIG. 3, for example, the die 120A is a radio frequency chip; and the die 120B is a high-bandwidth memory (HBM).

In some embodiments, the die 120A includes an active surface 120At, a plurality of contact pads 121A distributed on the active surface 120At, a bonding layer 123A covering the active surface 120At and a portion of the contact pads 121A, and a backside surface 120Ab opposite to the active surface 120At, where the contact pads 121A are partially exposed by openings 125A formed in the bonding layer 123A. As shown in FIG. 3, for example, the contact pads 121A are partially exposed by openings 125A formed in the bonding layer 123A, and the redistribution layer 160 is electrically connected to the die 120A by directly connecting the conductive structures M0 and the contact pads 121A.

In some embodiments, the die 120B includes an active surface 120Bt, a plurality of contact pads 121B distributed on the active surface 120Bt, a plurality of conductive vias 122B mechanically and electrically connected to the contact pads 121B, and a bonding layer 123B covering the active surface 120Bt and a portion of the contact pads 121B and surrounding sidewalls of the conductive vias 122B, and a backside surface 120Bb opposite to the active surface 120Bt. As shown in FIG. 3, for example, the conductive vias 122B is exposed by the bonding layer 123B, and the redistribution layer 160 is electrically connected to the die 120A by directly connecting the conductive structures M0 and the conductive vias 122B.

FIG. 4A to FIG. 4G are schematic cross-sectional views of various stages in a manufacturing method of a package structure according to some exemplary embodiments of the present disclosure. Referring to FIG. 1A to FIG. 1P and FIG. 4A to FIG. 4G together, the elements similar to or substantially the same as the elements described previously will use the same reference numbers, and certain details or descriptions (e.g. formation methods, materials, and so on) of the same elements may not be repeated herein.

In FIG. 4A to FIG. 4G, two dies are shown to represent plural dies of the wafer, and a package structure 40 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Figure 4A:
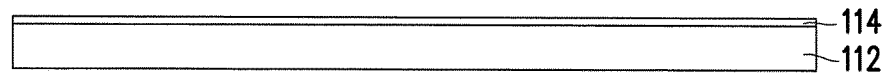
FIG. 4A to FIG. 4G are schematic cross-sectional views of various stages in a manufacturing method of a package structure according to some exemplary embodiments of the present disclosure.

Referring to FIG. 4A, in some embodiments, a carrier 112 with a debond layer 114 coated thereon is provided. In some embodiments, the debond layer 114 is disposed on the carrier 112, and the material of the debond layer 114 may be any material suitable for bonding and debonding the carrier 112 from the above layer(s) (e.g., the bonding layer 116) or any wafer(s) disposed thereon.

Figure 4B:
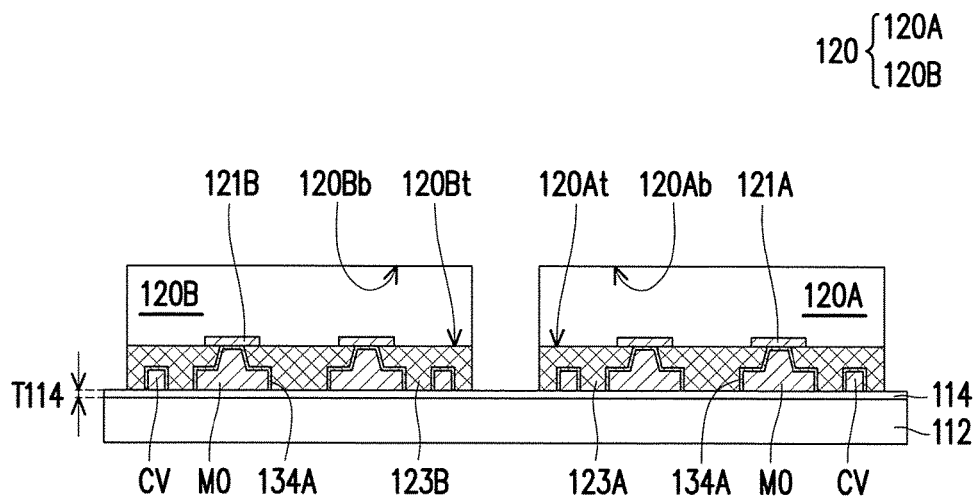

Referring to FIG. 4B, in some embodiments, at least one die 120 is provided and disposed on the debond layer 114. As shown in FIG. 4B, the die 120, for example, includes two dies, 120A and 120B. In some embodiments, the die 120A and the die 120B may be picked and placed on the debond layer 114, however the disclosure is not limited thereto.

In some embodiments, the die 120A includes an active surface 120At, a plurality of contact pads 121A, a bonding layer 123A, a plurality of conductive structures M0, a seed layer 134A, a plurality of connecting structures CV, and a backside surface 120Ab opposite to the active surface 120At. As shown in FIG. 4B, in certain embodiments, the contact pads 121A are distributed on the active surface 120At, the bonding layer 123A covers the active surface 120At and a portion of the contact pads 121A, the conductive structures M0 are formed in the bonding layer 123A, the seed layer 134A are formed in the bonding layer 123A and located between the bonding layer 123A and the conductive structures M0 and between the bonding layer 123A and the connecting structures CV, and the connecting structures CV are formed in the bonding layer 123A. In some embodiments, the connecting structures CV may include metal lines or metal pads. In some embodiments, the conductive structures M0 are electrically connected to the contact pads 121A through the seed layer 134A, respectively. In some embodiments, the bonding layer 123A, the conductive structures M0, the seed layer 134A, and the connecting structures CV together are considered as a redistribution circuit structure of the die 120A, which may provide routing function for the die 120A. As shown in FIG. 4B, for example, the die 120A is disposed on the carrier 112 by directly contacting the debond layer 114 and the bonding layer 123A. In one embodiment, due to the bonding layer 123A, by applying heat and pressure, the die 120A is adhered to and bonded on the debond layer 114, and a good adhesion between the die 120A and the debond layer 114 is ensured. In certain embodiments, the contact pads 121A, the seed layer 134A, the connecting structures CV, and the bonding layer 123A of the die 120A are in physical contact with the debond layer 114.

In some embodiments, the die 120B includes an active surface 120Bt, a plurality of contact pads 121B, a bonding layer 123B, a plurality of conductive structures M0, a seed layer 134A, a plurality of connecting structures CV, and a backside surface 120Bb opposite to the active surface 120Bt. As shown in FIG. 4B, in certain embodiments, the contact pads 121B are distributed on the active surface 120Bt, the bonding layer 123B covers the active surface 120Bt and a portion of the contact pads 121B, the conductive structures M0 are formed in the bonding layer 123B, the seed layer 134A are formed in the bonding layer 123B and located between the bonding layer 123B and the conductive structures M0 and between the bonding layer 123B and the connecting structures CV, and the connecting structures CV are formed in the bonding layer 123B. In some embodiments, the connecting structures CV may include metal lines or metal pads. In some embodiments, the conductive structures M0 are electrically connected to the contact pads 121B through the seed layer 134A, respectively. In some embodiments, the bonding layer 123B, the conductive structures M0, the seed layer 134A, and the connecting structures CV together are considered as a redistribution circuit structure of the die 120B, which may provide routing function for the die 120B. As shown in FIG. 4B, for example, the die 120B is disposed on the carrier 112 by directly contacting the debond layer 114 and the bonding layer 123B. In one embodiment, due to the bonding layer 123B, by applying heat and pressure, the die 120B is adhered to and bonded on the debond layer 114, and a good adhesion between the die 120B and the debond layer 114 is ensured. In certain embodiments, the contact pads 121B, the seed layer 134A, the connecting structures CV, and the bonding layer 123B of the die 120B are in physical contact with the debond layer 114. As shown in FIG. 4B, the die 120A and the die 120B are stably adhered to the carrier 112 through the bonding layer 123A and bonding layer 123B there-between by heating and pressing. In the disclosure, the bonding layer 123A and the bonding layer 123B are dielectric layers and are adherable under heat and pressure after fully curing or semi-curing. For example, after fully curing, the bonding layer 123A and the bonding layer 123B are adherable under a temperature range of about 150° C. to about 300° C. and a pressure range of about 2 bar to about 20 bar. The materials of the bonding layer 123A and the bonding layer 123B is the same as the material of the bonding layer 116/116A described in FIG. 1A and FIG. 1B, thus may not be repeated herein.

In some embodiments, due to the bonding layer 123A and the bonding layer 123B, a thickness T114 of the debond layer 114 may be in a range of about 0.5 µm to about 1.5 µm.

Figure 4C:
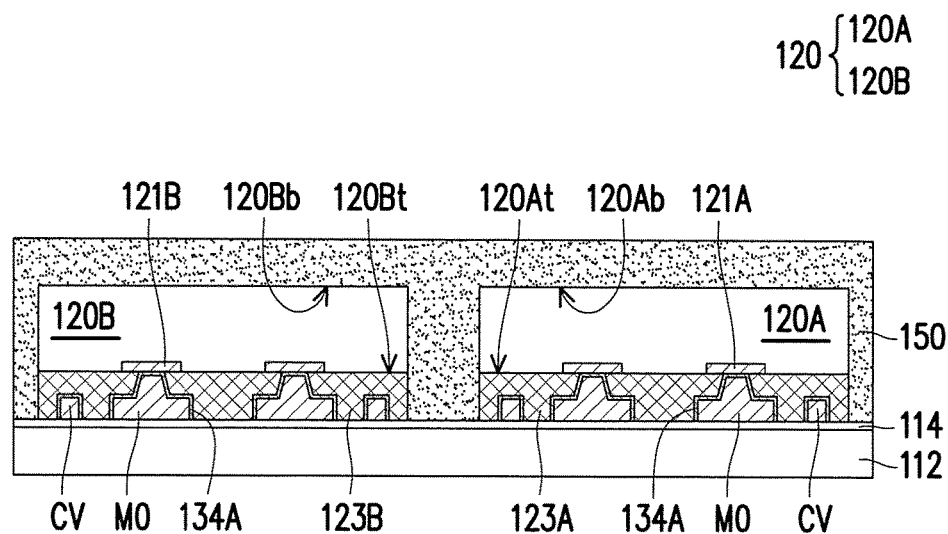

Referring to FIG. 4C, in some embodiments, the insulating encapsulation 150 is formed over the carrier 112, where the die 120A and the die 120B are encapsulated in the insulating encapsulation 150. In some embodiments, the insulating encapsulation 150 at least fills up the gaps between the die 120A and the die 120B. For example, as shown in FIG. 4C, the die 120A and the die 120B are not accessibly revealed by the insulating encapsulation 150. In other words, the insulating encapsulation 150 is over-molded over the die 120A and the die 120B, where a height of the insulating encapsulation 150 is greater than heights of the die 120A and the height of the die 120B.

Figure 4D:
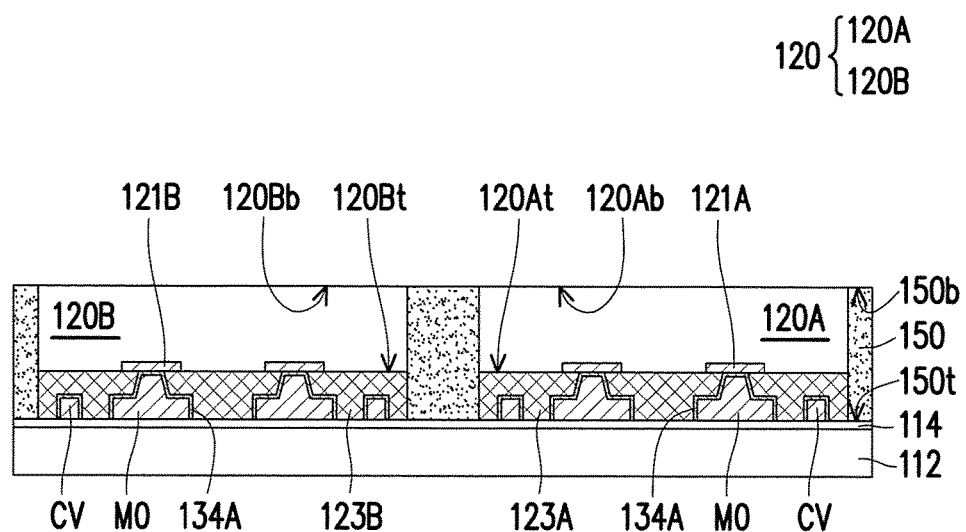

Referring to FIG. 4D, in some embodiments, a planarizing process is performed on the insulating encapsulation 150 until the bottom surface 120Ab of the die 120A and the bottom surface 120Bb of the die 120B being exposed by a bottom surface 150b of the insulating encapsulation 150. That is, after the planarizing process, the insulating encapsulation 150 is partially removed to expose the die 120A and the die 120B. In certain embodiments, after the planarizing process, the bottom surface 120Ab of the die 120A and the bottom surface 120Bb of the die 120B become substantially leveled with and coplanar to the bottom surface 150b of the insulating encapsulation 150. As shown in FIG. 4D, the top surface 150t of the insulating encapsulation 150 is substantially leveled with and coplanar to a surface of the bonding layer 123A and a surface of the bonding layer 123B.

During the planarizing process, a portion of the die 120A and a portion of the die 120B may also be removed. In some embodiments, the planarizing process may include a grinding process, fly cutting process, or a chemical mechanical polishing (CMP) process. After the planarizing process, a cleaning step may be optionally performed, for example to clean and remove the residue generated from the planarizing process. However, the disclosure is not limited thereto, and the planarizing process may be performed through any other suitable method.

Figure 4E:
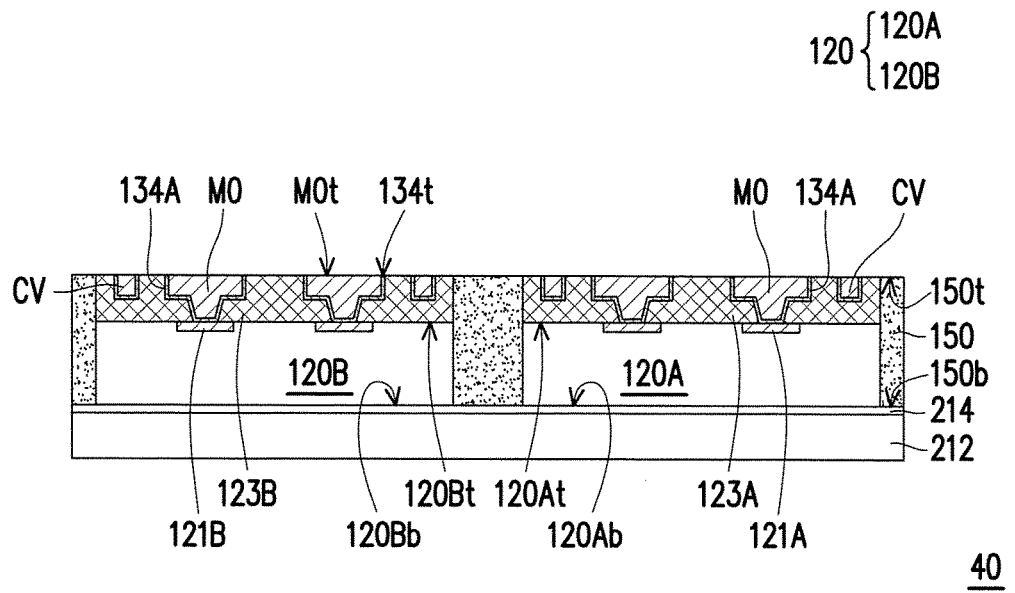

Referring to FIG. 4E, in some embodiments, the whole package structure 40 is flipped and bonded onto a carrier 212, where the carrier 112 is debonded. In certain embodiments, the whole package structure 40 flipped along with the carrier 112 is flipped (turned upside down) and then the carrier 112 is debonded from the bonding layer 123A of the die 120A, the bonding layer 123B of the die 120B, and the insulating encapsulation 150. In some embodiments, the die 120A, the die 120B, and the insulating encapsulation 150 are easily separated from the carrier 112 due to the debond layer 114. In some embodiments, the carrier 112 is detached from the seed layer 134A, the conductive structures M0, the connecting structures CV, the bonding layer 123A, the bonding layer 123B, and the insulating encapsulation 150 through a debonding process, and the carrier 112 and the debond layer 114 are removed. In certain embodiments, the top surface 150t of the insulating encapsulation 150, a surface 134t of the seed layer 134A, top surfaces M0t of the conductive structures M0, top surfaces of the connecting structures CV and a surface of the bonding layer 123A and a surface of the bonding layer 123B are exposed, as shown in FIG. 4E.

During the debonding step, a holding device (not shown) may be adopted to secure the package structures 40 before debonding the carrier 112 and the debond layer 114. For example, the holding device may be an adhesive tape, a carrier film or a suction pad. The disclosure is not limited thereto. In some embodiments, as shown in FIG. 4E, the die 120A, the die 120B, and the insulating encapsulation 150 are placed on the carrier 212 coated with a debond layer 214. For example, in FIG. 4E, the bottom surface 120Ab of the die 120A, the bottom surface 120Bb of the die 120B, and the bottom surface 150b of the insulating encapsulation 150 are directly connected to the debond layer 214.

Figure 4F:
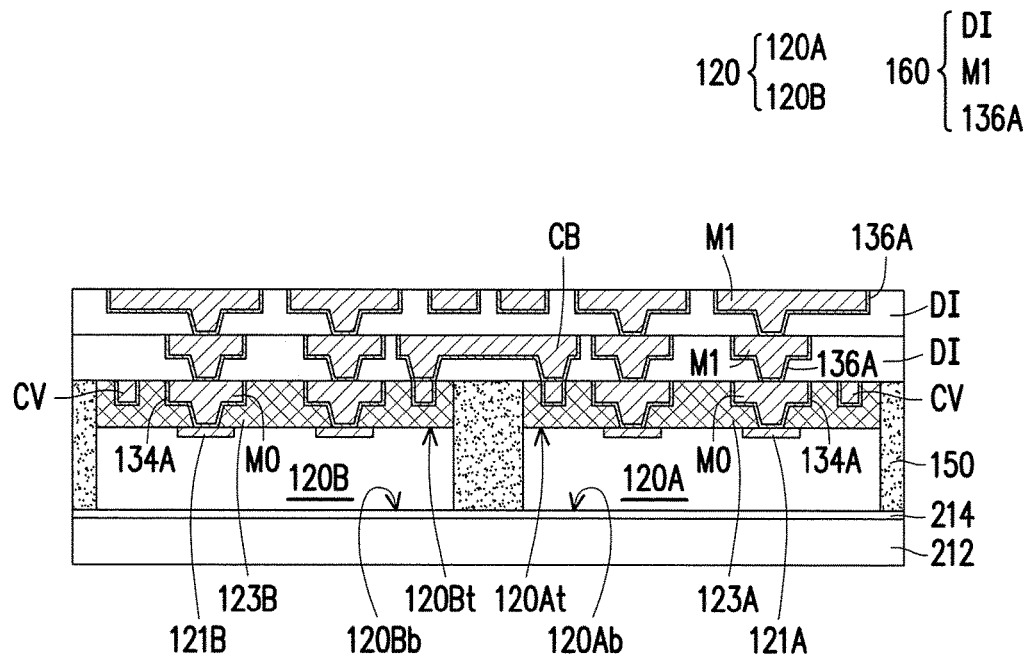

Referring to FIG. 4F, in some embodiments, a redistribution layer 160 is formed on the die 120A, the die 120B and the insulating encapsulation 150. In some embodiments, the redistribution layer 160 is formed on the top surface 150t of the insulating encapsulation 150, a surface 134t of the seed layer 134A, top surfaces M0t of the conductive structures M0, top surfaces of the connecting structures CV and the exposed surface of the bonding layer 123A and the exposed surface of the bonding layer 123B. In some embodiments, the redistribution layer 160 is mechanically and electrically connected to the seed layer 134A and the conductive structures M0. As shown in FIG. 4F, in some embodiments, the redistribution layer 160 is electrically connected to the die 120A through the conductive structures M0 and the contact pads 121A, and is electrically connected to the die 120B through the conductive structures M0 and the contact pads 121B, where the redistribution layer 160 provides a further routing function for the die 120A and the die 120B. In some embodiments, the redistribution layer 160 is a front-side redistribution layer electrically connected to the die 120A and the die 120B. As shown in FIG. 4F, the lowest layer of the metallization layers M1 of the redistribution layer 160 is directly formed on the bonding layer 123A of the die 120A and the bonding layer 123B of the die 120B without physically contacting the insulating encapsulation 150. Since the lowest layer of the metallization layers M1 of the redistribution layer 160 is directly formed on the bonding layer 123A and the bonding layer 123B, and the surface roughness of each of the bonding layer 123A and the bonding layer 123B where the lowest layer of the metallization layers M1 of the redistribution layer 160 formed thereon has a much smaller surface roughness (e.g. less than 1 μm) as comparing to that of the planarized surface of a conventional insulating encapsulation (which is disposed with a redistribution layer); and thus, the redistribution layer 160 with fine pitch is achieved.

In some embodiments, the redistribution layer 160 includes one or more dielectric layers DI and one or more metallization layers M1 arranged in alternation and one or more seed layers 136A located therebetween. In one embodiment, the seed layer 134A and the conductive structure M0 may be considered as a part of the redistribution layer 160. The numbers of the metallization layers, the seed layers, and the dielectric layers included in the redistribution layer 160 is not limited according to the disclosure. The formations and materials of the dielectric layers DI, the seed layer 136A, and the metallization layers M1 are described in FIG. 1N, thus may not be repeated herein.

Furthermore, in some embodiments, as shown in FIG. 4F, the redistribution layer 160 further includes at least one connecting bridge CB. In some embodiments, through the connecting bridge CB of the redistribution layer 160 and the connecting structures CV, the die 120A and the die 120B are electrically communicated to each other. Due to the connecting bridge CB, an electrical connection path from the die 120A to the die 120B or from the die 120B to the die 120B is greatly reduced, thereby improving the performance of the package structure 40.

Figure 4G:
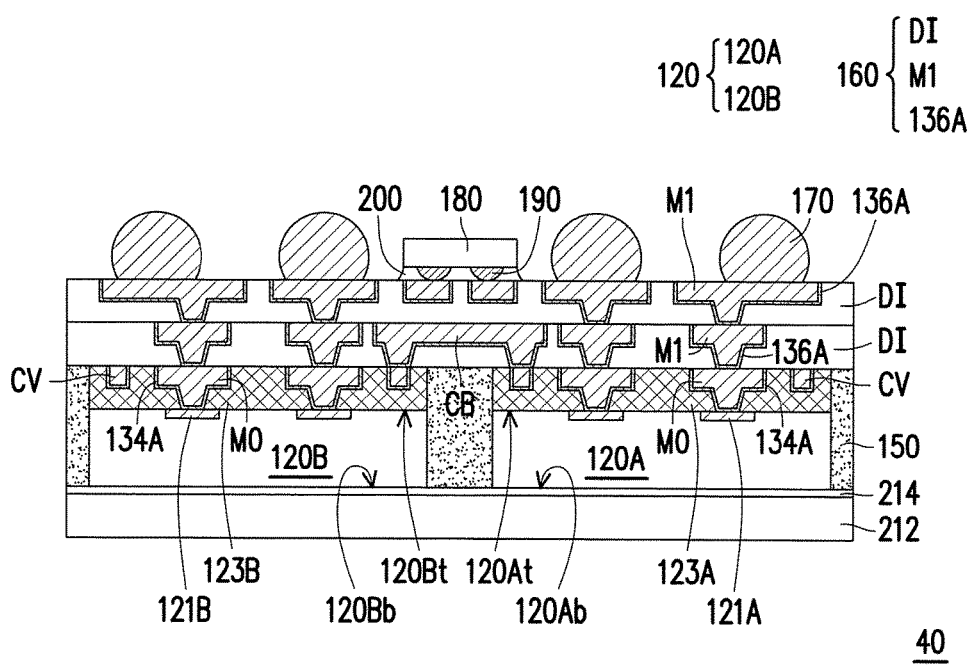

Referring to FIG. 4G, in some embodiments, a plurality of conductive elements 170 are formed to connect the redistribution layer 160. As shown in FIG. 4G, the conductive elements 170 are mechanically and electrically connected to the redistribution layer 160. In some embodiments, some of the conductive elements 170 are electrically connected to the die 120A through the redistribution layer 160 and the conductive structures M0. In some embodiments, some of the conductive elements 170 are electrically connected to the die 120B through the redistribution layer 160 and the conductive structures M0.

In some embodiments, as shown in FIG. 4G, at least one die 180 may be mounted on the redistribution layer 160. In some embodiments, the die 180 is disposed on the redistribution layer 160 by connectors 190 there-between. In some embodiments, the die 180 may be electrically connected to the die 120A through the connectors 190, the redistribution layer 160 and the conductive structures M0. In some embodiments, the die 180 may be electrically connected to the die 120B through the connectors 190, the redistribution layer 160 and the conductive structures M0. In some embodiments, some of the conductive elements 170 are electrically connected to the die 180 through the redistribution layer 160 and the connectors 190.

In some embodiments, as shown in FIG. 4G, an underfill material 200 is formed between the redistribution layer 160 and the die 180 and dispensed around the connectors 190. In some embodiments, the underfill material 200 at least fills the gaps between the connectors 190 and between the redistribution layer 160, the die 180 and the connectors 190. As shown in FIG. 4G, for example, the underfill material 200 is disposed on the redistribution layer 160 and wraps sidewalls of the connectors 190 to provide structural support and protection to the connectors 190. In some embodiments, prior to the formation of the conductive elements 170 and/or the die 180, a plurality of UBM patterns (not shown) may be formed on the topmost layer of the metallization layers M1 exposed by the topmost layer of the dielectric layers DI for electrically connecting the conductive elements 170 and/or the die 180 to the redistribution layer 160.

Up to here, the manufacture of the package structures 40 is completed. In some embodiments, a dicing process is performed to cut the wafer having a plurality of the package structures 40 into individual and separated package structures 40 without debonding the carrier 212, and the carrier 212 may serve as a heat dissipating element for the package structure 20. In one embodiment, the dicing process is a wafer dicing process including mechanical blade sawing or laser cutting.

In an alternative embodiment, the carrier 212 may be debonded from the die 120A, the die 120B and the insulating encapsulation 150 before the dicing process; however, the disclosure is not limited thereto. In such embodiment, the package structure 40 may be further mounted with an additional package, chips/dies or other electronic devices to form a stacked package structure. For example, based on the demand, the package structure 40 may be further mounted with an additional package, chips/dies or other electronic devices to form the stacked package structure through additional elements, such as conductive pillars (similar to the conductive pillars 140 depicted in FIG. 1P) and/or connectors.

Figure 5:
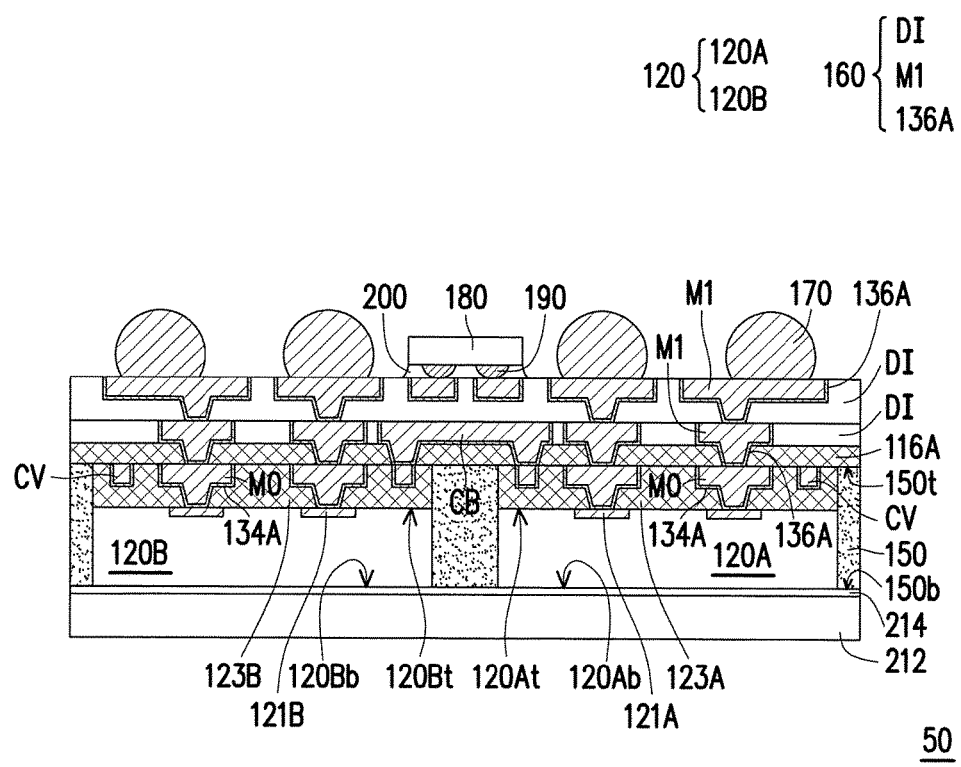
FIG. 5 a schematic cross-sectional view of a package structure according to some exemplary embodiments of the present disclosure.

FIG. 5 is a schematic cross-sectional view of a package structure according to some exemplary embodiments of the present disclosure. Referring to FIG. 4G and FIG. 5 together, the package structure 40 depicted in FIG. 4G and the package structure 50 depicted in FIG. 5 are similar; such that the elements similar to or substantially the same as the elements described above will use the same reference numbers, and certain details or descriptions of the same elements and the relationship thereof (e.g. the relative positioning configuration and electrical connection, formation methods, materials, and so on) will not be repeated herein. In FIG. 5, two dies are shown to represent plural dies of the wafer, and a package structure 50 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 4G and FIG. 5 together, the difference is that, for the package structure 50 depicted in FIG. 5, an additional element, a bonding layer 116A, is formed between the die 120A and the redistribution layer 160, between the die 120B and the redistribution layer 160, and the insulating encapsulation 150 and the redistribution layer 160. As shown in FIG. 5, for example, the bonding layer 116 has a plurality of openings (not marked) exposing portions (such as the conductive structures M0 and the connecting structures CV) of the die 120A and the die 120B. In some embodiments, through the openings formed in the bonding layer 116A, the lowest layer of the metallization layers M1 of the redistribution layer 160 penetrates through the bonding layer 116A to electrically connect to the conductive structures M0, and the connecting bridge CB penetrates through the bonding layer 116A to electrically connect to the connecting structures CV. As shown in FIG. 5, the die 120A and the die 120B are stably adhered to the bonding layer 116A through the bonding layer 123A and bonding layer 123B there-between by heating and pressing. The formation and materials of the bonding layer 116A are described in FIG. 1A and FIG. 1B or in FIG. 2A and FIG. 2B; and the bonding step of the die 120A, the die 120B and the bonding layer 116A is described in FIG. 1C or in FIG. 2C, thus may not be repeated herein. Due to the lowest layer of the metallization layers M1 of the redistribution layer 160 is not directly formed on the insulating encapsulation 150, the redistribution layer 160 with fine pitch is achieved.

Figure 6:
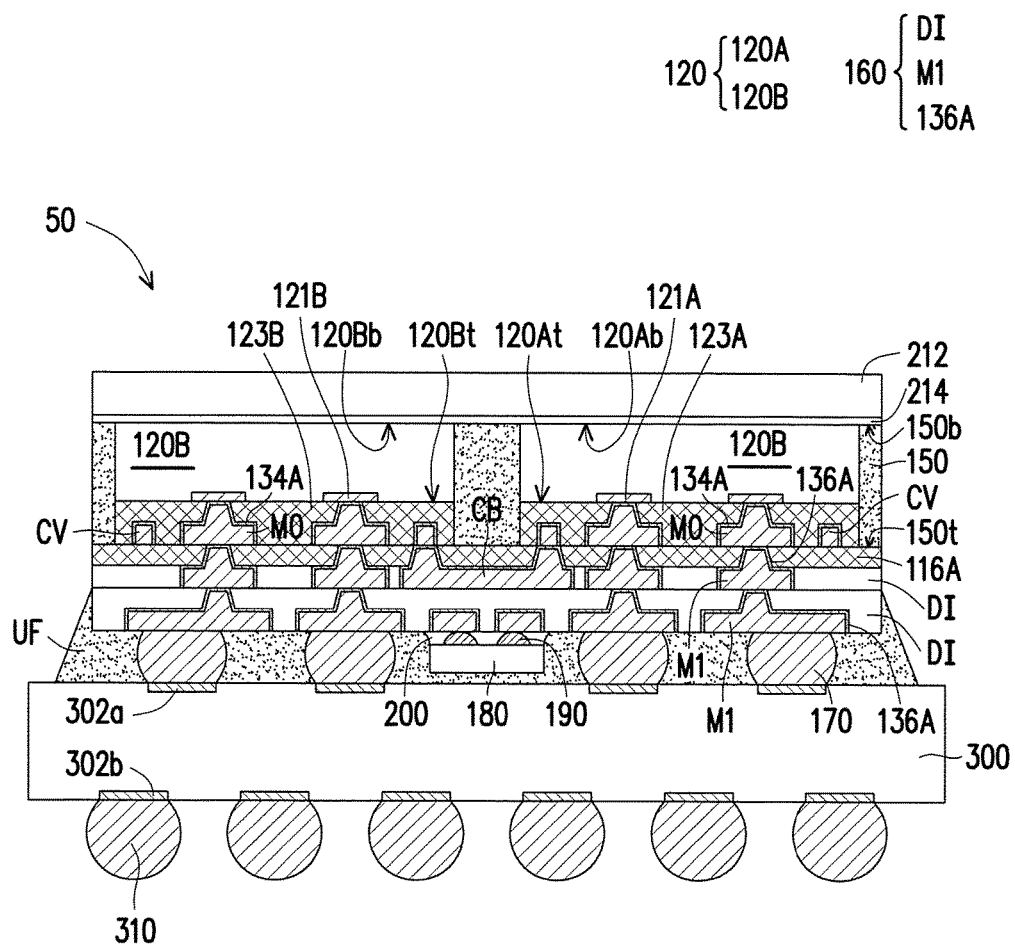
FIG. 6 a schematic cross-sectional view of a package structure according to some exemplary embodiments of the present disclosure.

FIG. 6 is a schematic cross-sectional view of a package structure according to some exemplary embodiments of the present disclosure. Referring to FIG. 6, in some embodiments, a package circuit substrate 300 is provided. In one embodiment, the package circuit substrate 300 may include an organic substrate, a ceramic substrate. In an alternative embodiment, the package circuit substrate 300 may include a printed circuit board (PCB). In some embodiments, the package circuit substrate 300 includes contact pads 302a and contact pads 302b distributed on two opposite surfaces thereof, and a plurality of conductive elements 310 are disposed on the contact pads 302b. For example, as shown in FIG. 6, the package structure 50 is mounted to the package circuit substrate 300 by directly connecting the conductive elements 170 and the contact pads 302a. In some embodiments, a reflow processing is preformed to physically connect the conductive elements 170 and the contact pads 302a.

In some embodiments, the conductive elements 310 are, for example, solder balls or ball grid array (BGA) balls, or other connectors for connecting to an external device. In some embodiments, the material of the conductive elements 310 may be the same or different from the material of the conductive elements 170, the disclosure is not limited thereto.

In some embodiments, an underfill material UF is formed between the package structure 50 and the package circuit substrate 300. In certain embodiments, the underfill material UF at least fills the gaps between the conductive elements 170 and between the package structure 50, the package circuit substrate 300 and the conductive elements 170. As shown in FIG. 6, for example, the underfill material 200 covers and is in contact with the conductive elements 170 and a sidewall of the redistribution layer 160. In one embodiment, the underfill material UF may be formed by underfill dispensing or any other suitable method. In some embodiments, a material of the underfill material UF may be the same or different from the materials of the underfill material 200 and/or the insulating encapsulation 150.

According to some embodiments, a package structure includes an insulating encapsulation, at least one first chip, a redistribution layer and a bonding layer. The at least one first chip is encapsulated in the insulating encapsulation. The redistribution layer is located on the insulating encapsulation and the at least one first chip and electrically connected to the at least one first chip. The bonding layer mechanically connects the redistribution layer and the at least one first chip.

According to some embodiments, a manufacturing method of a package structure is provided with the following steps: providing a carrier; forming a dielectric adhesive layer having first openings on the carrier; disposing at least one first chip with a bonding layer having second openings on the dielectric adhesive layer to spatially communicate one of the first openings and a respective one of the second openings; bonding the at least one first chip on the dielectric adhesive layer by heating and pressing; forming an insulating encapsulation to encapsulate the at least one first chip; forming conductive structures in the first openings; forming a redistribution layer on the insulating encapsulation; and forming conductive elements on the redistribution layer.

According to some embodiments, a manufacturing method of a package structure is provided with the following steps: providing a carrier; disposing at least one first chip provided with a first dielectric adhesive layer and a plurality of conductive structures in the first dielectric adhesive layer on the carrier; bonding the at least one first chip onto the carrier through the first dielectric adhesive layer by heating and pressing; forming an insulating encapsulation to encapsulate the at least one first chip; performing a backside planarizing step to level a surface of the insulating encapsulation and a rear surface of the at least one first chip; forming a redistribution layer on the first dielectric adhesive layer of the at least one first chip; and forming conductive elements on the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    an insulating encapsulation;
    at least one first chip, encapsulated in the insulating encapsulation;
    a redistribution layer, located on the insulating encapsulation and the at least one first chip and electrically connected to the at least one first chip; and
    a bonding layer, having two opposite sides physically connected to the redistribution layer and the at least one first chip, respectively.

2. The package structure of claim 1, further comprising a metal layer comprising a first portion and a second portion physically separated from the first portion, wherein the first portion of the metal layer surrounds the at least one first chip, and the at least one first chip is separated from the insulating encapsulation by the first portion of the metal layer.

3. The package structure of claim 1, wherein the redistribution layer comprises at least one dielectric layer, and a material of the bonding layer is different from a material of the at least one dielectric layer of the redistribution layer.

4. The package structure of claim 1, further comprising a second chip disposed on and electrically connected to the redistribution layer, wherein the first redistribution layer is located between the second chip and the at least one first chip.

5. The package structure of claim 1, wherein the at least one first chip comprises two first chips, and each of the two first chips comprises at least one interconnection structure, wherein the two first chips are electrically communicated to each other through the interconnection structures and the redistribution layer.

6. The package structure of claim 1, further comprising a package circuit substrate electrically connected to the redistribution layer through a plurality of conductive elements.

7. The package structure of claim 2, wherein the at least one first chip comprises contact pads and a protection layer partially covering the contact pads, wherein a surface of the protection layer is substantially leveled with and coplanar to a surface of the first portion of the metal layer.

8. The package structure of claim 2, wherein the second portion of the metal layer partially covers a surface of the bonding layer and penetrates through the bonding layer.

9. The package structure of claim 8, further comprising a plurality of vias encapsulated in the insulating encapsulation, wherein the plurality of vias penetrate through the insulating encapsulation and the bonding layer, and the plurality of vias are physically separated from the bonding layer by the second portion of the metal layer.

10. A manufacturing method of a package structure, comprising:
    providing a carrier;
    forming a dielectric adhesive layer having first openings on the carrier;
    disposing at least one first chip with a bonding layer having second openings on the dielectric adhesive layer to spatially communicate one of the first openings and a respective one of the second openings;
    bonding the at least one first chip on the dielectric adhesive layer by heating and pressing;
    forming an insulating encapsulation to encapsulate the at least one first chip;
    forming conductive structures in the first openings;
    forming a redistribution layer on the insulating encapsulation; and
    forming conductive elements on the redistribution layer.

11. The manufacturing method of claim 10, wherein before forming the insulating encapsulation to encapsulate the at least one first chip, the manufacturing method further comprises forming a metal layer having a first portion and a second portion physically separated from the first portion, wherein the first portion covers the at least one first chip and separates the at least one first chip from the insulating encapsulation, and the second portion penetrates the dielectric adhesive layer and electrically connected to the redistribution layer.

12. The manufacturing method of claim 10, further comprising planarizing insulating encapsulation to level a surface of the insulating encapsulation and a rear surface of the at least one first chip so that the surface of the insulating encapsulation and the rear surface of the at least one first chip are substantially coplanar to each other.

13. The manufacturing method of claim 10, further comprising forming a second chip on the redistribution layer, wherein the second chip is electrically connected to the least one first chip through the redistribution layer.

14. The manufacturing method of claim 10, wherein after forming the conductive elements on the redistribution layer, the manufacturing method further comprises mounting the conductive elements onto a package circuit substrate.

15. The manufacturing method of claim 11, further comprising forming a plurality of vias located aside of the at least one first chip, penetrating through the insulating encapsulation and the dielectric adhesive layer, wherein the plurality of vias contact the second portion and are electrically connected to the at least one first chip through the second portion and the redistribution layer.

16. A manufacturing method of a package structure, comprising:
    providing a carrier;
    disposing at least one first chip provided with a first dielectric adhesive layer and a plurality of conductive structures in the first dielectric adhesive layer on the carrier;
    bonding the at least one first chip onto the carrier through the first dielectric adhesive layer by heating and pressing;
    forming an insulating encapsulation to encapsulate the at least one first chip;
    performing a backside planarizing step to level a surface of the insulating encapsulation and a rear surface of the at least one first chip;
    forming a redistribution layer on the first dielectric adhesive layer of the at least one first chip; and
    forming conductive elements on the redistribution layer.

17. The manufacturing method of claim 16, wherein before disposing the at least one first chip provided with the first dielectric adhesive layer on the carrier, the manufacturing method further comprising forming a second dielectric adhesive layer on the carrier.

18. The manufacturing method of claim 16, further comprising forming a second chip on the redistribution layer, wherein the second chip is electrically connected to the least one first chip through the redistribution layer.

19. The manufacturing method of claim 16, wherein after forming the conductive elements on the redistribution layer, the manufacturing method further comprises mounting the conductive elements onto a package circuit substrate.

20. The manufacturing method of claim 17, wherein bonding the at least one first chip onto the carrier comprises bonding the at least one first chip onto the second dielectric adhesive layer formed on the carrier through the first dielectric adhesive layer by heating and pressing.

* * * * *